United States Patent
Petrovic et al.

(10) Patent No.: US 10,871,575 B2
(45) Date of Patent: Dec. 22, 2020

(54) MULTI-MODE FREQUENCY COMPENSATION IN MOBILE TERMINALS

(71) Applicant: VIASAT, INC., Carlsbad, CA (US)

(72) Inventors: Branislav A Petrovic, Falls Church, VA (US); Michail K Tsatsanis, Huntington Beach, CA (US)

(73) Assignee: Viasat, Inc., Carlsbad, CA (US)

(*) Notice: Subject to any disclaimer, the term of this patent is extended or adjusted under 35 U.S.C. 154(b) by 153 days.

(21) Appl. No.: 16/171,775

(22) Filed: Oct. 26, 2018

(65) Prior Publication Data

US 2020/0132859 A1    Apr. 30, 2020

(51) Int. Cl.
| | |
|---|---|
| *G01S 19/29* | (2010.01) |
| *G01S 19/23* | (2010.01) |
| *G01S 5/00* | (2006.01) |
| *G01S 19/25* | (2010.01) |
| *H04B 7/01* | (2006.01) |

(52) U.S. Cl.
CPC .......... *G01S 19/29* (2013.01); *G01S 5/0027* (2013.01); *G01S 19/23* (2013.01); *G01S 19/256* (2013.01); *H04B 7/01* (2013.01); *G01S 5/0036* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 5,323,164 | A | * | 6/1994 | Endo | ...................... G01S 19/29 342/357.65 |
| 5,742,908 | A | * | 4/1998 | Dent | ......................... H03J 7/02 342/358 |
| 5,878,330 | A | * | 3/1999 | Naumann | .................. H03J 7/02 342/402 |
| 6,463,266 | B1 | * | 10/2002 | Shohara | .................... H03J 7/04 375/219 |
| 6,661,371 | B2 | | 12/2003 | King et al. | |
| 7,061,972 | B1 | * | 6/2006 | Best | ....................... G01S 19/29 342/357.66 |
| 7,088,955 | B2 | | 8/2006 | Challa et al. | |

(Continued)

OTHER PUBLICATIONS

Lin, "Frequency Offset Estimation Technique Based on Error Characterization for OFDM Communications on Time-Varying Multipath Fading Channels", 2006 IEEE International Conference on Communications, pp. 2911-2916.

(Continued)

*Primary Examiner* — Yuwen Pan
*Assistant Examiner* — Erica L Fleming-Hall
(74) *Attorney, Agent, or Firm* — Holland & Hart LLP

(57) ABSTRACT

Systems and methods are described herein for multi-mode compensation of frequency errors within signals transmitted and received by a mobile terminal. The frequency error can be due to Doppler shift and oscillator error, which introduce opposite frequency shifts. In an acquisition mode, the mobile terminal initially compensates for the oscillator error while transmitting a signal to a communication system that contains the Doppler shift. Upon receiving a message from the communication system indicating the Doppler shift contained in the transmit signal, the mobile terminal can then switch to a tracking mode that can compensate for both Doppler shift and oscillator error.

18 Claims, 10 Drawing Sheets

(56) References Cited

U.S. PATENT DOCUMENTS

| | | | |
|---|---|---|---|
| 7,409,226 B1* | 8/2008 | Stevenson | H04B 7/0802 |
| | | | 342/417 |
| 7,477,189 B2 | 1/2009 | Wang et al. | |
| 7,928,811 B2 | 4/2011 | Brodie | |
| 8,489,018 B2 | 7/2013 | Irvine et al. | |
| 8,773,305 B1* | 7/2014 | Ramlall | G01S 19/24 |
| | | | 342/357.68 |
| 9,113,475 B2 | 8/2015 | Ben-Eli | |
| 9,479,207 B2 | 10/2016 | Henderson et al. | |
| 2003/0201935 A1* | 10/2003 | King | G01S 19/30 |
| | | | 342/357.62 |
| 2006/0203950 A1* | 9/2006 | Chung | H03J 1/0083 |
| | | | 375/376 |
| 2007/0014389 A1* | 1/2007 | Kawai | H04L 7/10 |
| | | | 375/355 |
| 2010/0220819 A1* | 9/2010 | Li | H04L 27/266 |
| | | | 375/344 |
| 2011/0009054 A1* | 1/2011 | Irvine | H04B 7/18513 |
| | | | 455/9 |
| 2011/0279313 A1* | 11/2011 | Joo | G01S 19/24 |
| | | | 342/357.51 |
| 2012/0236920 A1* | 9/2012 | Ben-Eli | H04W 76/28 |
| | | | 375/226 |
| 2012/0313815 A1* | 12/2012 | Yang | G01S 19/235 |
| | | | 342/357.23 |
| 2012/0315915 A1* | 12/2012 | Ohm | H04W 36/32 |
| | | | 455/440 |
| 2014/0062781 A1* | 3/2014 | Mathews | G01S 19/246 |
| | | | 342/357.64 |
| 2015/0358192 A1* | 12/2015 | Nilsson | H04L 27/2657 |
| | | | 375/349 |

OTHER PUBLICATIONS

Nezami, "DSP-Based Carrier Acquisition and Tracking for Burst TDMA Mobile Land and Satellite Receivers", Applied Microwave & Wireless, vol. 13, No. 9, Sep. 2001, pp. 24-41.

Cao et al., "Two stage frequency offset pre-compensation scheme for satellite mobile terminals" 2018 IEEE Conference on Industrial Electronics and Applications (ICIEA), IEEE, May 31, 2018, pp. 117-122.

"Geo-Mobile Radio Interface Specifications (Release 3): Third Generation Satellite Packet Radio Service; Part 5: Radio interface physical layer specifications; Sub-part 7: Radio Subsystem Synchronization; GMR-1 3G 45.010" Technical Specification European Telecommunications Standards Institute (ETSI), 650, Route Des Lucioles; F-06921 Sophia-Antipolis; France, vol. SES SCN. No. V3.4.1, Oct. 1, 2015, (Oct. 1, 2015), X014265217, Section 6; pp. 29-35.

PCT/US19/056602; International Search Report and Written Opinion, dated Dec. 12, 2019, 13 pages.

* cited by examiner

MULTI-MODE FREQUENCY COMPENSATION IN MOBILE TERMINALS

BACKGROUND

High bandwidth satellite communication systems provide a wide range of communication capabilities, including television, telephone, radio, internet, and military applications. High-bandwidth may be provided in communications networks by employing radio frequencies in the 20-30 GHz range and precisely synchronizing terminals with a communication system (e.g., a communication satellite) to minimize error rates and maximize the communication quality of service. A source of frequency errors is drift of the oscillator used in mobile and stationary terminals. Mobile terminals in high-bandwidth communication systems experience additional frequency errors due to the Doppler shift caused by movements of the mobile terminal with respect to the communication system.

The Doppler shift experienced in mobile terminals is independent of oscillator errors, and thus additive to both transmitted and received signals. This is unlike oscillator errors, which introduced a positive or negative frequency shift during down-conversion of received signals but introduce an opposite (i.e., negative or positive) frequency shift during up-conversion of signals for transmission. This asymmetric overall error contribution complicates compensating for both sources of overall frequency error (oscillator error and Doppler shift) in mobile terminals, particularly while attempting to establish a communication link. A conventional solution to this problem in high bandwidth satellite communication systems has been to use very accurate, stable oscillators in mobile terminals, effectively removing errors due to oscillator frequency drift, so that compensation is primarily required for the frequency error due to Doppler shift. However, accurate, stable oscillators are expensive, relatively large, and consume greater power, thus limiting their use to high-end, high-value applications.

SUMMARY

In one embodiment, a method of frequency correction in a mobile terminal is described. The method includes receiving, by the mobile terminal, a first receive signal from a communication system. The method further includes operating the mobile terminal in an acquisition mode. Operating in the acquisition mode includes processing, by the mobile terminal, the first receive signal to determine a first receive frequency error. Operating in the acquisition mode further includes determining a first frequency correction by applying a first correction procedure to the first receive frequency error. The first correction procedure compensates for a first oscillator error within the first receive frequency error due to an oscillator in the mobile terminal. Operating in the acquisition mode further includes transmitting a first transmit signal that is frequency-corrected by the first frequency correction. Operating in the acquisition mode further includes receiving, by the mobile terminal, a first message from the communication system. The first message indicates a first Doppler shift of the first receive frequency error as determined by the communication system using the first transmit signal. Operating in the acquisition mode further includes determining, by the mobile terminal, the first oscillator error based on the first receive frequency error and the first Doppler shift. Operating in the acquisition mode further includes storing the determined first oscillator error as a preceding oscillator error. The method further includes switching operation of the mobile terminal from the acquisition mode to the tracking mode. The tracking mode includes iteratively performing operations that include processing a second receive signal received from the communication system to determine a second receive frequency error, the second receive frequency error including a second oscillator error due to the oscillator and a second Doppler shift. The operations further include determining a second frequency correction by applying a second correction procedure to the second receive frequency error, where the second correction procedure compensates for the preceding oscillator error and the second Doppler shift. The operations further include transmitting a second transmit signal to the communication system that is frequency-corrected by the second frequency correction. The operations further include updating the stored preceding oscillator error based on a subsequent message received from the communication system, the subsequent message indicating a difference between the second oscillator error and the preceding oscillator error that was determined by the communication system using the second transmit signal.

In another embodiment, a mobile terminal is described. The mobile terminal includes an oscillator, a receiver circuit configured to downconvert signals received from a communication system using a frequency signal from the oscillator, and a transmit circuit configured to upconvert a baseband signal to a transmission frequency using the frequency signal from the oscillator. The mobile terminal further includes a memory and a processor coupled to the receive circuit, the transmit circuit and the memory. Instructions are stored in the memory and executable by the processor to receive from the receiver circuit a downconverted first received signal received from a communication system. The instructions include instructions to operate in an acquisition mode. The acquisition mode includes processing the first received signal to determine a first received frequency error. The acquisition mode further includes determining a first frequency correction by applying a first correction procedure to the first receive frequency error, where the first correction procedure compensates for a first oscillator error within the first receive frequency error due to the oscillator. The acquisition mode further includes transmitting to the communication system via the transmit circuit a first transmit signal that is frequency-corrected by the first frequency correction. The acquisition mode further includes receiving a first message from the communication system, the first message indicating a first Doppler shift of the first receive frequency error as determined by the communication system using the first transmit signal. The acquisition mode further includes determining the first oscillator error based on the first receive frequency error and the first Doppler shift. The acquisition mode further includes storing the determined first oscillator error component as a preceding oscillator error. The instructions further include instructions to switching operation from the acquisition mode to the tracking mode. The tracking mode includes iteratively performing operations including processing a second receive signal received from the communication system after downconversion by the receiver circuit to determine a second receive frequency error, the second receive frequency error including a second oscillator error due to the oscillator and a second Doppler shift. The operations further include determining a second frequency correction by applying a second correction procedure to the second receive frequency error, where the second correction procedure compensates for the preceding oscillator error and the second Doppler shift. The operations further include transmitting via the transmit circuit a second transmit signal to the communication system that is frequency-corrected by the second frequency correction. The operations further include updating the stored preceding oscillator error based on a subsequent message received from the communication system, the subsequent message indicating a difference between the second oscillator error and the preceding oscillator error that was determined by the communication system using the second transmit signal.

BRIEF DESCRIPTION OF THE DRAWINGS

The accompanying drawings, which are incorporated herein and constitute part of this specification, illustrate exemplary embodiments, and together with the general description given above and the detailed description given below, serve to explain the features of various embodiments.

DETAILED DESCRIPTION

Figure 1:
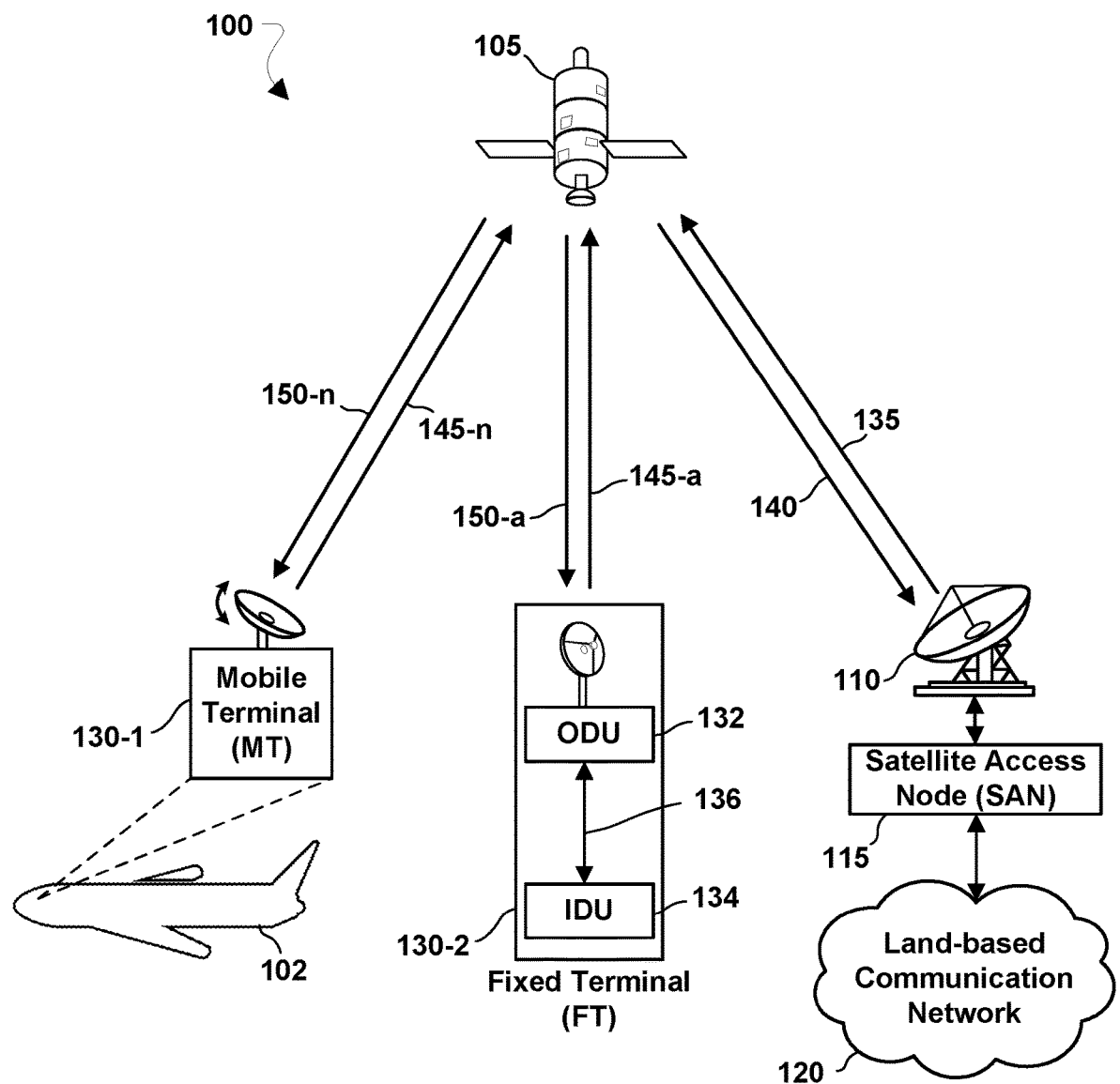
FIG. 1 is a block diagram of a communication network including a mobile terminal and a communication system suitable for use with various embodiments.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of various embodiments or the claims.

The term "communication system" is used herein to refer to one or more elements of a communication network with which a mobile terminal may communicate. Communication systems may include a communication satellite access node (e.g., a ground station node that feeds a geosynchronous communication satellite). References to a mobile terminal communicating with a communication system may include messages and signals exchanged between the mobile terminal and a communication satellite access node.

As used herein, the term "signal" refers to a radio frequency waveform which, when received by a terminal or communication system and appropriately processed, can yield information (e.g., the carrier frequency) about that signal. Transmissions whose primary purpose is the estimation of frequency or other physical layer parameters are also sometimes called sync signals. The term "message" as used herein refers to data (e.g., within the payload of a packet) carried by the signal that is used to exchange information between the terminal and the communication system.

The term "frequency error" is used herein generally to refer to the difference between the expected frequency of a particular signal and the actual frequency of the same signal that is observed by a processor on the receiving end of the communication link. There are multiple sources contributing to frequency error, including Doppler shift, oscillator error introduced during upconversion or downconversion of signals, and error in the estimation of the frequency of received signals at the receiver end of a communication link. As used herein, the term "oscillator error" (referred to as "$f_e$" herein) refers to the difference between the carrier frequency of a downlink (or forward link) signal transmitted by a communication system (referred to as "$f_c$" herein) and the frequency of the local oscillator in the mobile terminal. Oscillator error is also used to refer to the difference between the frequency of the local oscillator in the mobile terminal and the frequency of an uplink (or return link) signal expected by the communication system (also referred to as "$f_c$" herein). For ease of reference, the carrier frequency of the downlink and the expected frequency of the uplink may be referred to herein as the "correct frequency" $f_c$. In embodiments, frequency estimate errors may not play a significant role in the various embodiments and may be reduced by averaging frequency estimations, and are therefore not specifically addressed in order to simplify descriptions of various embodiments.

In various embodiments described herein, the communication system sends messages encoded within signals transmitted to the mobile terminal that include information about frequency errors observed by the communication system in signals received from the mobile terminal. Because a message from the communication system to the mobile terminal is encoded within a signal, in some embodiments the mobile terminal may both (i) estimate the current frequency (and thus frequency error) of the received signal and (ii) obtain from the received message the frequency error information that is communicated to it from the communication system within the message content of the signal.

Various embodiments provide systems and methods for enabling mobile terminals in high bandwidth and high carrier frequency communication networks to employ less expensive and smaller oscillators in the transmitter and receiver circuits. Less expensive and smaller oscillators may be employed by compensating for the initial large oscillator offset in the mobile terminal during an acquisition mode, which enables the communication system to estimate the Doppler shift using the terminal's acquisition reply signal. In a tracking mode that is entered after the acquisition mode finishes, the mobile terminal estimates the faster changing Doppler error component, while the communication system estimates and communicates to the mobile terminal the slower oscillator error drift component in a reversal of roles. In various embodiments, the frequency error information may be provided by the communication system in the same downlink pathway as all message traffic to the mobile terminal.

Under ideal conditions, the receiving radio within a mobile terminal would downconvert a received radio frequency (RF) signal by mixing the received signal with a frequency signal provided by an oscillator operating at the same frequency as the RF signal transmitted by a transmitting device. The resulting downconverted signal is at baseband frequency that a processor (e.g., a modem) can process to recover encoded message data. However, under normal operating conditions several sources of frequency errors along the transmission path and within the mobile terminal result in a mismatch between the received RF signal frequency and the transmitted frequency. This mismatch in frequencies can prevent reception (i.e., lock-in on the received signal) and/or lead to errors in recognizing symbols in received signals during the decoding process.

Two sources of frequency errors in mobile terminals are oscillator error and Doppler shift. The oscillator error may be primarily due to instability (referred to as "drift") in the mobile terminal oscillator and can decrease receiver coherency and increase the communication error rate. The Doppler shift is due to the motion of the mobile terminals with respect to a communication system. Thus, communication errors can be caused by the frequency shifts in the received and transmitted RF signals due to the Doppler effect as mobile terminals move relative to the communication system. High carrier frequency communication systems employing signal frequencies in the millimeter (mm)-wave range (e.g., 20-30 GHz, typical in satellite communication networks) are particularly vulnerable to these frequency errors. In such communication networks, even small oscillator errors or Doppler shifts may result in large frequency shifts and can dramatically increase error rates and decrease communication quality. Thus, active compensation for both oscillator errors and Doppler shift can be required in a mobile terminal to support high carrier frequency communications.

Active compensation for frequency errors is accomplished by mobile terminals in high carrier frequency communication systems by pre-compensating for the frequency errors by shifting the frequency an appropriate amount before signals are transmitted. Shifting the frequency of a transmitted signal by a small amount, for pre-compensation or other reasons, can be implemented using a variety of circuits or methods. In analog implementations, the transmitted frequency may be shifted by adjusting the frequency of a mixer's Voltage Controlled Oscillator or the set point of a Phased Lock Loop (PLL). In digital implementations, the transmitted frequency may be shifted by baseband frequency shifting using a digital complex modulator. Such a digital circuit may include a Numerically Controlled Oscillator driving a programmable CORDIC phase rotator, and adjusting the frequency shift amounts to adjusting the step size of the Numerically Controlled Oscillator.

Mobile terminals may also estimate the frequency or composite frequency error of a received signal in a multitude of ways. If training signals or pilots are embedded in the received signals (e.g., signals transmitted by a communication system), then digital estimation methods may be used in the mobile terminal to estimate the frequency, such as estimating the phase of successive pilots and deducing the frequency from the phase difference. Other methods that may be used in a mobile terminal include maximum likelihood methods, joint phase, frequency and data detection, etc. Analog circuits for the purpose of estimating the frequency or composite frequency error of a received signal can include FM discriminators and specially designed phase lock loops (PLLs).

A conventional solution to reduce communication errors in mobile terminals uses an accurate, stable oscillator in the mobile terminal so that the oscillator error is minimized, enabling the mobile terminal to treat the totality of the observed frequency error solely as Doppler shift. Such an oscillator enables the demodulation and modulation of a signal with very little oscillator error, which enables the mobile terminal to neglect the oscillator error and focus instead on any Doppler shift (e.g., operating in a Doppler cancellation mode) when pre-compensating transmitted signals for frequency error. However, such accurate, stable oscillators are relatively large, consume greater power at the mobile terminal, and are relatively expensive.

Lower cost oscillators are more attractive in the production of mobile terminals, allowing high-bandwidth communications to be implemented in more applications. However, lower cost oscillators can be relatively unstable and thus introduce greater oscillator errors.

Various embodiments described herein provide a technique for frequency compensation in high-bandwidth and high carrier frequency communication systems that enable compensating for both Doppler shift and oscillator errors in mobile terminals by determining the Doppler shift during an acquisition mode and then compensating for both oscillator errors and Doppler shift in a tracking mode.

In the acquisition mode, a mobile terminal may receive a synchronization signal (a sync signal) from a communication system. When received by the mobile terminal and downconverted, the sync signal has a composite frequency error made up of the Doppler shift plus an oscillator error that was introduced when the oscillator output is mixed with the received signal in order to downconvert it. In the acquisition mode, the mobile terminal is configured to estimate the composite frequency error of the downconverted received signal. However, since Doppler shift and oscillator error introduce opposite frequency shifts, determining the composite frequency error is not sufficient to determine the portion of the error that is attributed to the Doppler shift and the portion that is attributed to the oscillator error. Thus, as described in more detail below, in the acquisition mode the mobile terminal is configured such the oscillator error is compensated for while transmitting a signal to the communication system that contains the Doppler shift of the received signal.

The mobile terminal may then generate a first signal for transmission to the communication system at a baseband frequency that pre-compensates (i.e., before up-conversion) for the composite frequency error observed in (or determined from) the received synchronization signal. Normally, frequency pre-compensation of a transmitted signal will compensate for oscillator error (crystal drift) and Doppler shift in opposite directions, adding a compensation for crystal drift but subtracting the Doppler shift. This is because the Doppler shift observed in signals received by the mobile terminal is also added to transmitted signals when received by the communication system, while the oscillator error introduced in downconverting received signals is introduced with an opposite sign and thus removed in upconverting transmitted signals.

Initially (e.g., during an acquisition mode), the mobile terminal can determine the composite frequency error, but does not have information to enable individual determination of the oscillator error and Doppler shift. In this situation, the mobile terminal can only pre-compensate for the composite frequency error, leaving two choices: (i) pre-compensate in the additive (+) direction, which will correct (or compensate) for the Doppler component but will double the crystal drift component of the composite error when received by the communication system, or (ii) pre-compensate in the subtractive (−) direction, which will correct the crystal drift component but double the Doppler component when received by the communication system. Which choice is preferable can depend on which error component is larger.

In some cases, an initial frequency error of a lower cost oscillator may be relatively large compared to the error due to the Doppler shift. For example, in mm-wave frequencies initial oscillator error can be as much as 2 MHz, while Doppler shift will be less than 35 KHz, even for aircraft travelling at the speed of sound. By compensating for the estimated composite error in the mobile terminal in the acquisition mode in the +direction that will double the Doppler shift (e.g., to less than 2×35 kHz), the first signal transmitted from the mobile terminal to the communication system should exhibit a reduced frequency error compared to compensating for the estimated composite error in the −direction that will double the oscillator error (i.e., 2×2 MHz). A signal received with a frequency error of double the Doppler shift may be within the system lock-in range of the communication system, while a signal with twice the oscillator error may not. If the communication system lock in range is smaller than the worst case uncompensated Doppler error (e.g., less than 2×35 KHz), then the mobile terminal may repeat the first transmitted signal multiple times, with each transmission at a slightly different frequency (e.g., with slightly different pre-compensation) such that at least one of the multiple signals frequency will fall within the lock in range of the communication system.

When the mobile terminal transmits the first signal with frequency compensation based on the observed composite frequency error in the +direction (also referred to herein as a "first correction procedure"), errors due to the oscillator will be cancelled out leaving the Doppler shift in the transmitted signal so the communication system will observe a frequency error in the received signal that is twice the Doppler shift due to movement of the mobile terminal with respect to the communication system. The communication system may then transmit a first message to the mobile terminal that indicates the observed frequency error that is twice the Doppler shift (or in some embodiments an estimate of the Doppler shift). The mobile terminal may receive the first message and use the information in the message to determine the Doppler shift within the composite frequency error, while also determining the composite frequency error in the signal carrying the first message. In some embodiments, the mobile terminal may determine the Doppler shift to be half of the frequency error reported by the communication system in the first message. In some embodiments, the first message may identify the Doppler shift as a value that the mobile terminal can store in memory. With information regarding the Doppler shift, the mobile terminal may determine the preceding oscillator error by subtracting the determined Doppler shift from the composite frequency error. The mobile terminal may store the determined preceding oscillator error in memory for use in an initial iteration of operations in a tracking mode. At this point, the mobile terminal may transition to the tracking mode.

In the tracking mode, the mobile terminal transmits signals to the communication system which are pre-compensated for Doppler shift and oscillator error (less any oscillator drift). This is accomplished by the mobile terminal processing a receive signal received from the communication system to determine a subsequent composite frequency error of the receive signal. In the tracking mode, the subsequent composite frequency error of the received signal is used to pre-compensate the transmit frequency in the minus (−) direction while also using the preceding oscillator error in the plus (+) direction (also referred to herein as a "second correction procedure"), thereby correcting for the Doppler error and some of oscillator error (or all of the oscillator error if there is no oscillator drift). In the first iteration of the tracking mode operations, the frequency correction is determined using the preceding oscillator error stored during the acquisition mode.

The information about the composite frequency error of the received signal can be periodically or continuously tracked and the stored preceding oscillator error updated as the terminal continues to receive signals and via exchange of messages with the communication system. The communication system can determine the frequency error observed in received signals and indicate the frequency error in messages sent to the mobile terminal. This frequency error is proportional to the drift in the oscillator error. In particular, this frequency error is due to a difference between the actual oscillator error at the time the oscillator is used to generate a transmit signal to the communication system, and the stored preceeding oscillator error used to pre-compensate the transmit frequency of the transmit signal. The information regarding the frequency error observed by the communication system may be provided in the same communication pathway/downlink as all messages transmitted from the communication system to the mobile terminal (i.e., not in a separate physical control channel). This process is performed iteratively, repeated regularly or periodically in a long feedback loop with the communication system informing the mobile terminal about frequency errors observed by the communication system in messages sent to the mobile terminal and the mobile terminal updating the compensation for the oscillator error based on the received messages. As both error components are compensated for and updated in this manner, the acquisition mode need not be repeated so long as the tracking mode is maintained.

Thus, in the tracking mode the mobile terminal continuously or periodically compensates the appropriate frequency pre-compensation for oscillator errors as well as correcting for Doppler shift, transmits a signal with the frequency adjusted by the pre-compensation, receives a message from the communication system indicating the frequency error observed in that signal, and updates the frequency pre-compensation based on this information in a closed loop fashion. In a satellite communication system, the time between transmission of signals from the mobile terminal to reception of corresponding frequency error information can be long (e.g., 0.25 to 0.5 seconds) compared to the bit or packet duration of the communication link, and thus this process is referred to as long-loop feedback. This enables the mobile terminal to iteratively adjust the compensation applied to transmitted signals to accommodate changes in Doppler shift and oscillator drift.

Various embodiments may be implemented within a variety of communication systems and networks. FIG. 1 is a block diagram illustrates a wireless communication network 100 suitable for implementing various embodiments. The communication network 100 may include a communication satellite 105, one or more terminals such as a mobile terminal (MT) 130-1 and a fixed terminal (FT) 130-2, and one or more Satellite Access Nodes (SANs) 115 (also referred to herein as communication systems). The mobile terminal 130-1, fixed terminal 130-2 and the SANs 115 may be configured to communicate with one another via the communication satellite 105. The SANs 115 may also be configured to communicate with a land-based communication network 120.

In various embodiments, the communication satellite 105 may be in a geostationary orbit or in low earth orbit (LEO). In some embodiments, the satellite 105 may be configured as a "bent pipe" satellite. In such a configuration, the satellite 105 may perform frequency and polarization conversions of received carrier signals before re-transmission of the signals to a destination. The satellite 105 may provide a service area of communication, which may be divided into a plurality of areas each provided with communication services by a spot beam of RF transmissions. A spot beam may use a single carrier, e.g., a single frequency, or a contiguous frequency range per beam. The use of spot beams to provide communication services within the service area enables frequency re-use across multiple narrowly focused spot beams (e.g., on the order of hundreds of kilometers) spanning the globe beneath the satellite.

The land-based communication network 120 may include, for example, the Internet, an IP network, an intranet, a WAN, a LAN, a VPN, a VLAN, a fiber optic network, a hybrid fiber-coax network, a cable network, a PSTN, a PSDN, a public land mobile network, and/or any other type of network supporting communications between devices as described herein. The communication network 120 may include both wired and wireless connections as well as optical links. The communication network 120 may connect the SAN 115 with other SANs (not illustrated), which may also communicate with the satellite 105.

The SAN 115 may be a ground station that functions as a communication gateway or hub. A SAN 115 will typically include an antenna 110 configured to transmit an uplink signal 135 to the satellite 105 and receive a downlink signal 140 from the satellite 105. In some embodiments, the antenna 110 may include a parabolic reflector with high gain or directivity in the pointing direction (i.e., toward the satellite 105) and low gain in other directions. In various embodiments, the antenna 110 may include a variety of alternative configurations and operating features such as high isolation between orthogonal polarizations, high efficiency in the operational frequency bands, and low noise.

The fixed terminal 130-2 may include an outdoor unit (ODU) 132 and an indoor unit (IDU) 134 that may communicate via an interface 136. The ODU 132 may perform front-end radio and antenna functions and may receive a forward downlink signal 150-a from the satellite 105 and may transmit a return uplink signal 145-a to the satellite 105. The IDU 134 may perform modem and networking functions and may provide an interface, e.g., to customer premises equipment (CPE), such as computers, local area networks, internet appliances, wireless networks, and other similar devices and systems. In some embodiments, the interface 136 between the IDU 202 and the ODU 206 may include an inter-facility link (IFL) or similar communication link, the construction and characteristics of which may vary depending on functional partitioning between the ODU 132 and the IDU 134. For example, the interface 136 may consist of a single coaxial cable of variable length depending on the physical arrangement of the components and the particular application.

Mobile terminals 130-1 (e.g., on-board an aircraft 102 or other mobile vehicle) may move within a service area of the satellite 105. Mobile terminal 130-1 may communicate with the satellite 105 via one or more spot beams of the satellite 105 while moving with respect to the satellite 105. In various embodiments, the communication system 100b enables the mobile terminal 130-1 to communicate with a destination on the network 120 via the satellite 105 and the SAN 115. The mobile terminal 130-1 may receive data from the satellite 105 via downlink signals 150-n and transmit data to the satellite 105 via uplink signals 145-n. In some embodiments, the mobile terminal 130-1 may include a very small aperture terminal (VSAT) antenna, which may measure approximately 0.6 meters in diameter and transmit at approximately 2 watts of power. In other embodiments, a variety of other types of antennas may be used in the mobile terminal 130 to communicate with the satellite 105.

The uplink and downlink signals 135, 140, 145-a, 145-n, 150-a, 150-n may include a plurality of carrier signals, frequencies, or frequency bands, each of which may be configured into a plurality of logical channels via physical layer transmission modulation and coding techniques. The uplink and downlink signals 135, 140, 145-a, 145-n, 150-a, 150-n may utilize one or more channel access schema, such as MF-TDMA, TDMA, FDMA, OFDMA, CDMA, and combinations thereof.

Figure 2:
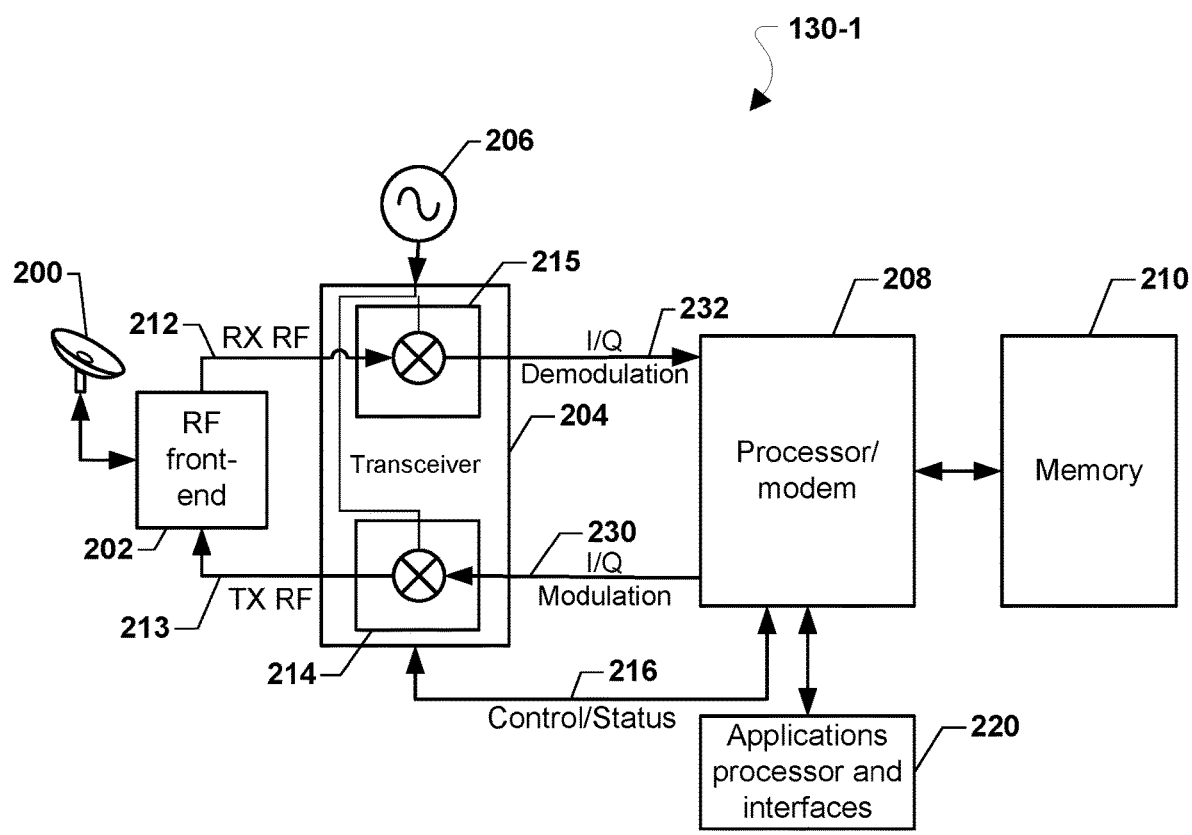
FIG. 2 is a block diagram of an example mobile terminal suitable for use with the various embodiments.

FIG. 2 is a block diagram of an example mobile terminal 130-1 suitable for implementing various embodiments. A mobile terminal 130-1 may include a radio frequency (RF) antenna 200 connected to a radio frequency (RF) front-end 202 that includes the amplifier circuits for sending and receiving RF transmissions via the antenna 200. The RF front-end 202 separates transmit and receive RF signal paths and provides amplification and signal distribution. RF signals for transmission 213 (TX RF) and received RF signals 212 (RX RF), are passed between the RF front-end 202 in the transceiver 204.

The transceiver 204 includes receiver circuitry 215 having one or more stages configured to down-convert a received RF signal 212 from received frequency by effectively subtracting the frequency signal provided by the oscillator 206 (e.g., in a mixer) to yield a signal 232 for baseband demodulation by a processor 208, which may be a baseband modem or the like. The transceiver 204 may be similarly configured with transmit circuitry 214 having one or more stages to upconvert a signal 230 from the processor 208 that encodes data using baseband modulation by effectively adding the frequency signal provided by the oscillator 206 (e.g., in a mixer) to yield to a transmitted RF signal 213.

In mobile terminals that transmit and receive at different frequencies, the oscillator frequency is multiplied up to each of the two different frequencies using frequency multipliers (not shown). The two frequency multipliers are driven by the same oscillator, thus the RX and TX frequencies are coherent, with only a scaling factor difference (and thus introducing coherent frequency error and drift in both upconversion and downconversion).

The transceiver 204 may be configured to output I/Q modulation data 232, in which "I" is the amplitude of the in-phase carrier and "Q" is the amplitude of the quadrature-phase carrier.

A mobile terminal 130-1 may include a memory 210 coupled to the processor 208 and configured to store data for the processor 208, as well as processor programs (also referred to as instructions executable by the processor 208). The memory will 210 may be any form of volatile or nonvolatile memory.

The processor 208 may be configured to demodulate incoming baseband receive I/Q signals to extract encoded data, which may be passed to an applications processor and/or interfaces 220. The processor 208 may also be configured to encode and modulate information to be transmitted in a message into baseband transmit I/Q signals that are passed to the transceiver 204 for up-converting to the transmission frequency by mixing the baseband signal with a frequency signal from the oscillator 206. The processor 208 may also be configured to process data and/or send data and commands to enable various circuit blocks, including the transceiver 204.

The processor 208 sends control signals to the transceiver 204 and receives status signals from the transceiver 204 through a data bus 216. In various embodiments, such control signals may include, for example, turning the transceiver 204 on and off, changing RF channels, and adjusting the transmit frequency to pre-compensate for frequency errors including Doppler shift and oscillator drift. The processor 208 may also be configured to read the state of transceiver 204, as well as receive various interrupt signals from the transceiver 204.

A conventional mobile terminal includes a highly stable and accurate oscillator that enables receiver circuitry to downconvert a received RF signal without introducing a large frequency error due to oscillator error. Thus, the composite frequency error that will be observed by the processor in the downconverted signals will be primarily due to the Doppler shift $f_d$ due to movement of the mobile terminal with respect to the communication system. Using a highly stable and accurate oscillator, a conventional mobile terminal can transmit signals to a communication system (e.g., 110) by pre-compensating for the Doppler shift before up-converting the signal for transmission. Again, the motion of the mobile terminal with respect to the communication system introduces a Doppler shift $f_d$, which is compensated for by the inverse of the Doppler shift (i.e., $-f_d$) pre-compensation. As a result of doing so, the communication system receives the message at or near the correct frequency $f_c$.

Neglecting the oscillator error $f_e$ in pre-compensating for frequency errors in transmissions may be possible in a mobile terminal employing a stable, accurate oscillator. Using a lower cost oscillator that is less stable and less accurate can require the mobile terminal to compensate for the oscillator error $f_e$ in frequency corrections in order to reliably communicate with the communication system. Thus, using a less stable oscillator can require the mobile terminal to compensate for the oscillator error $f_e$ and the Doppler shift $f_d$ in the uplink transmission. A complication in doing so is that the frequency errors introduced by the oscillator error and the Doppler shift require corrections are in opposite directions on the uplink transmission. Therefore, the errors introduced by both the oscillator error $f_e$ and the Doppler shift $f_d$ cannot be resolved with knowledge of the composite frequency error. This complicates establishing and maintaining a communication link between a communication system and a mobile terminal when both oscillator error and Doppler shift are significant as well as when the oscillator error drifts (i.e., changes) over time.

Figure 3:
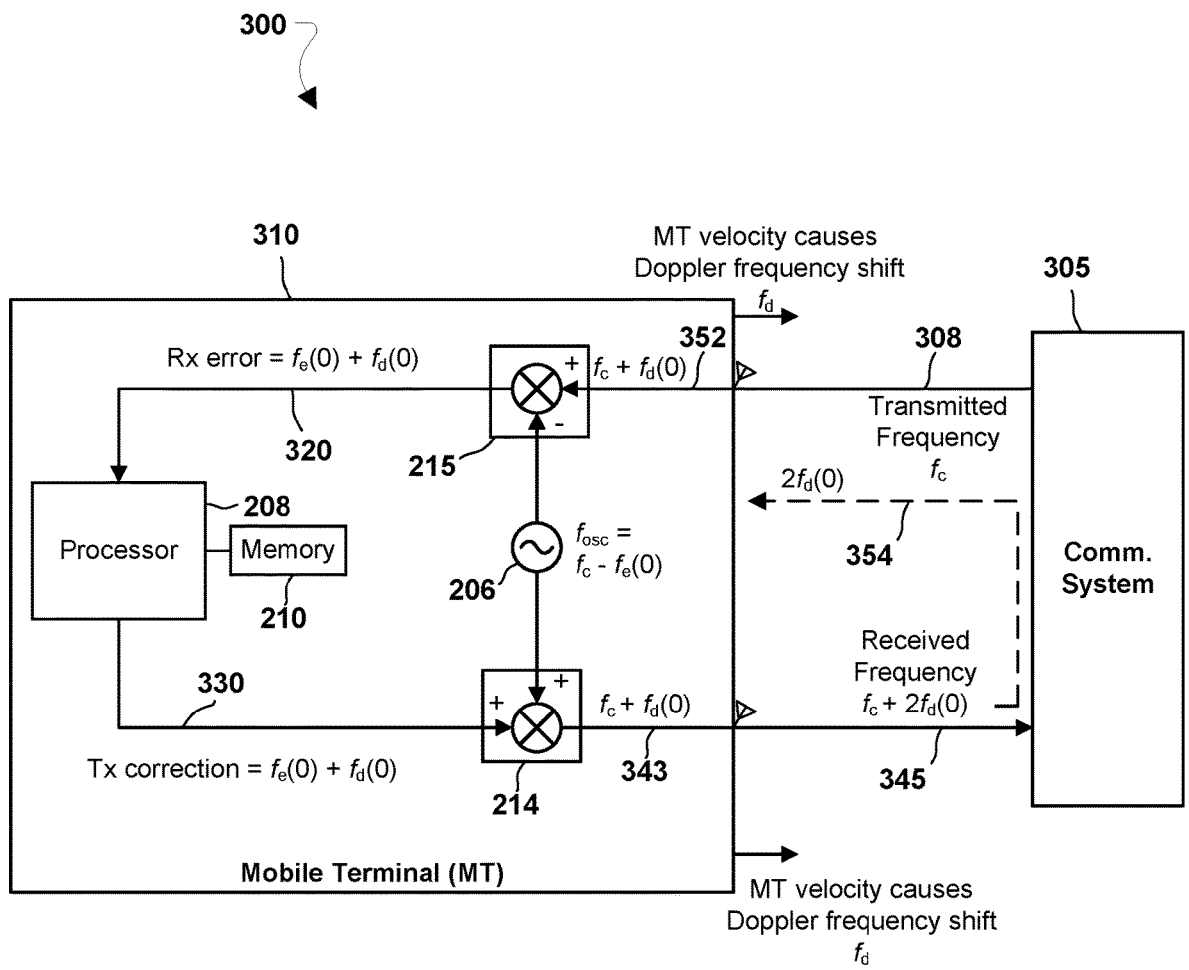
FIG. 3 is a block diagram illustrating components, signals, and frequency error components in an acquisition mode of a mobile terminal according to various embodiments.

FIG. 3 is a block diagram illustrating components, messages and frequency error components in an acquisition mode of a mobile terminal according to various embodiments in which the uplink and downlink frequencies are the same. With reference to FIGS. 1-3, in the acquisition mode 300, a mobile terminal 310 (e.g., the mobile terminal 130-1) may exchange signals with a communication system 305 (e.g., a communication satellite access node 115) to obtain an estimate of the current Doppler shift between the mobile terminal and the communication system.

The mobile terminal 310 may include receiver circuitry 215, transmit circuitry 214, an oscillator 206, and a processor 208. The receiver circuitry 215 may downconvert a received RF signal 352 that includes a Doppler shift $f_d$ using a frequency signal from the oscillator 206 to generate a downconverted signal 320. In various embodiments, the oscillator 206 may be a low-cost oscillator exhibiting a relatively unstable and variable oscillator error $f_e$. Thus, the downconverted signal 320 includes both a Doppler shift $f_d$ and a frequency error $f_e$ from the oscillator 206 introduced during downconversion in the receiver circuitry 215.

In the acquisition mode of operation, the mobile terminal 310 may receive a sync signal 308 (or other signal) from the communication system 305 at an initial time (e.g., t=0), such as a periodic standard format signal or probe transmitted at a preset frequency and with a preset pattern known to the mobile terminal. The mobile terminal 310 may detect the sync signal by monitoring frequencies within a band centered about the known preset frequency while searching for the preset pattern within sync signals. As described above, the sync signal 308 will be received by an antenna (e.g., 200) of the mobile terminal 310 as a received sync signal 352 with a frequency equal to the transmitted frequency $f_c$ plus the Doppler shift $f_d$ (0) due to relative movement of the mobile terminal with respect to the communication system. Upon receiving the sync signal, the mobile terminal may demodulate the sync signal using signals from the oscillator 206 to generate a downconverted signal 320 that is processed by processor 208 to recover the data encoded within the modulation of the symbol.

Since the oscillator 206 is a low cost oscillator exhibiting a relatively unstable and variable oscillator error $f_e$, demodulating or downconverting the received sync signal 352 using signals from the oscillator 206 in the receiver circuitry 215 introduces an oscillator error $f_e(0)$ defined as the difference between the desired frequency of the oscillator 206, which will be the same as or proportional to the transmitted frequency $f_c$ for transmitted signals, and the current oscillator frequency $f_{osc}$. Thus, the processor 208 receives a downconverted signal 320 that includes a composite frequency error (Rx frequency error) equal to the sum of the oscillator error $f_e(0)$ and the Doppler shift $f_d$ (0) (i.e., $R_x=f_d(0)+f_e(0)$). As described above, a variety of methods and circuits may be used to estimate the frequency or composite frequency error of the received signal, including digital estimation methods, maximum likelihood methods, joint phase, frequency and data detection, and specially designed PLLs. Additionally, the processor may estimate the composite frequency error for a number of sync signals and average the results to reduce estimation errors. The processor may store the composite frequency error in memory 210 as an RX error at time t=0.

At this point, the processor 208 knows the composite frequency error, but has no information regarding the portion due to Doppler shift $f_d$ (0) and the portion due to the oscillator error $f_e(0)$. As described above, active compensation for frequency errors can be implemented using a variety of circuits or methods. Also as explained above, at this point in the acquisition mode when the processor processes only the composite frequency error information, the processor can only pre-compensate for frequency error in signals for transmission by either adding the composite frequency error, which will compensate for oscillator frequency error $f_e(0)$ when the signal is upconverted using (i.e., added to) signals from the oscillator that introduced the error but will double the Doppler shift $f_d$ (0) observed by the communication system, or subtracting the composite frequency error, which will compensate for Doppler shift $f_d$ (0) but double the oscillator frequency error $f_e(0)$ in the transmitted signal. For mobile terminals using a lower-cost, lower-accuracy oscillator, doubling the oscillator error could result in a transmitted signal that is beyond the lock in range of the communication system. Therefore, in various embodiments the reply signal 330 generated by the processor 208 includes a Tx frequency correction (or pre-compensation) that is equal to the composite Rx frequency error determined by the processor (i.e., $T_x = R_x = f_d$ (0)+$f_e(0)$) so that the frequency error observed by the communication system in the reply signal will be approximately twice the Doppler shift and not twice the oscillator frequency error. When that reply signal 330 is upconverted to the transmission frequency in the transmit circuitry 214 using the frequency signal from the same oscillator 206 as used in receiver circuitry 215, the oscillator error $f_e(0)$ component will cancel out, which leaves the Doppler shift $f_d$ (0) component added to the transmission frequency $f_c$ in the transmit signal 343 that is transmitted by an antenna (e.g., 200) of the mobile terminal 310.

Again, the transmitted transmit signal 343 will incur the same Doppler shift $f_d$ (0) as picked up in the initial sync signal 308. Therefore, the transmit signal 345 received by the communication system 305 will have a frequency equal to the correct frequency $f_c$ plus twice the Doppler shift (i.e., $f_c + 2f_d$ (0)). As described above, the communication system may employ a variety of methods and circuits to determine the frequency of the received reply signal, including digital estimation methods, maximum likelihood methods, joint phase, frequency and data detection, and specially designed PLLs. By determining the difference between the correct frequency $f_c$ and the frequency of the received transmit signal 345 (i.e., the observed frequency error), the communication system 305 can determine the Doppler shift $f_d$ experienced by the mobile terminal 310 as one half the observed frequency error.

In some embodiments, the communication system 305 may send a message 354 (i.e., a signal that includes data packets) to the mobile terminal 310 transmitted at the same downlink carrier frequency (i.e., $f_c$) that includes information indicating the calculated Doppler shift $f_d$ (0). The manner in which the message indicates the calculated Doppler shift $f_d$ (0) can vary from embodiment to embodiment. In some embodiments, the message contains either the frequency error observed in the received transmit signal 345 or a calculated Doppler shift $f_d$ (0). In some embodiments, the communication system 305 may send a message 354 to the mobile terminal 310 transmitted at the correct frequency $f_c$ that includes information regarding the observed frequency error (i.e., $2f_d$ (0)), and the mobile terminal 310 can determine the composite error component due to Doppler shift $f_d$ (0) by dividing by 2. In various embodiments, the communication system 305 transmits the message 354 with the Doppler shift or observed frequency error information as data using in-channel signaling (i.e., not in a separate control channel).

In this manner, upon receiving the message (e.g. by processing a signal containing the message 354), the processor 208 learns the Doppler shift $f_d$ (0) present when the sync and transmit signals were exchanged (i.e., at time t=0) from the information received from the communication system 305 in the second message 354. The processor 208 may store this Doppler shift information in memory 210. Learning the initial Doppler shift $f_d$ (0) in the sync and reply signal exchanges from the communication system (i.e., at a first time t=0) and having determined and stored in memory the composite frequency error, $R_x = f_d$ (0)+$f_e(0)$, in the sync signal, the processor 208 is able to use subtraction to estimate the oscillator error component $f_e(0)$ within the composite frequency error in the sync signal. Thus, at this point the processor knows the current composite frequency error $R_x = f_d(1) + f_e(1)$ from processing the signal carrying the message 354 (i.e., at a second time t=1) and an estimate of the oscillator error during the preceding exchange of sync and transmit signals (i.e., at the first time t=0). The oscillator error during the preceding exchange is referred to herein as the preceding oscillator error. With this information, the mobile terminal processor 208 is able to estimate the oscillator error based on the composite frequency error (Rx error) determined from received signals, and therefore may enter the tracking mode that is described below with reference to FIG. 4 for embodiments in which the uplink and downlink frequencies are the same.

The above description of the acquisition operation of FIG. 3 assumes that the receivers of the mobile terminal 310 and the communication system 305 have sufficient frequency lock-in range to be able to successfully demodulate the sync signal and transmit signal, respectively. If the mobile terminal 310 does not have sufficient lock-in range to accommodate the frequency error in the received sync signal, the mobile terminal may repeat the demodulation attempts each time varying the frequency of the terminal oscillator $f_{osc}$ until the frequency error is within the lock-in range. Similarly, if the communication system 305 does not have sufficient lock-in range, the communication system 305 may repeat the demodulation attempts, each time varying the receiver target demodulation frequency. In some embodiments, the communication system 305 may search a frequency range about the correct frequency $f_c$ of four times the estimated Doppler shift (e.g., $\pm 2f_d$) to enable signal acquisition. Alternatively, the mobile terminal 310 may retransmit the transmit signal, each time varying the transmit frequency, until the frequency error is within lock-in range of the communication system 305, which the mobile terminal 310 may determine from receipt of a response message 354.

Figure 4:
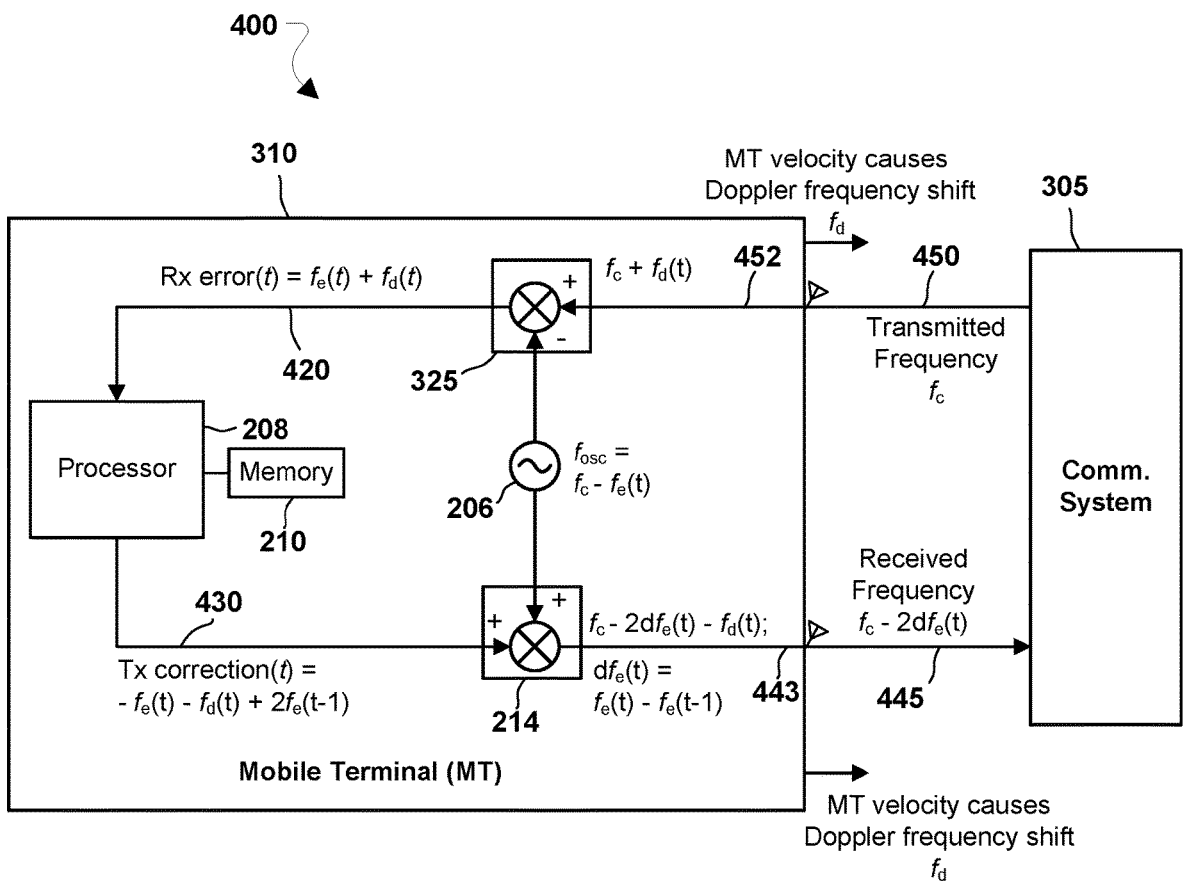
FIG. 4 is a block diagram illustrating components, signals, and frequency error components in a tracking mode of a mobile terminal according to various embodiments.

In the tracking mode, the mobile terminal is configured to compensate for the Doppler shift by subtracting the Doppler shift from the transmission so essentially no Doppler shift remains once received by the communication system. What frequency error remains will be due to the difference between the previous (or preceding) oscillator error (at time=t−1) that has been stored, and the current oscillator error (at time t) due to oscillator drift. The difference between the previous (or preceding) oscillator error $f_e(t-1)$ and the current oscillator error $f_e(t)$ is referred to herein as the oscillator drift. FIG. 4 is a block diagram illustrating components, messages and frequency error components in a tracking mode of a mobile terminal according to various embodiments in which the uplink and downlink frequencies are the same. With reference to FIGS. 1-4, the tracking mode 400 may include a long feedback loop of frequency error correction information provided by the communication system 305 that the mobile terminal 310 may use to compensate for changes or drift in the oscillator error. In some embodiments, the mobile terminal 310 may update the pre-compensation for frequency error for transmitting messages by using frequency error data received from the communication system 305 in subsequent messages in a long feedback loop that enables the processor to adjust or compute a new frequency error compensation that adjusts for drift in the oscillator frequency output in a closed loop manner.

Referring to FIG. 4, in the tracking mode, the mobile terminal 310 receives messages within signals 450 received from the communication system 305 at various times t. Such signals 450 from the communication system 305 are transmitted at the correct (i.e., carrier) frequency $f_c$ but appear shifted by the Doppler shift $f_d(t)$ when received as signals 452 by the mobile terminal 310. Thus, the received signals 452 processed by the receiver circuitry 215 have a frequency of $f_c+f_d(t)$. As described above, the mobile terminal receiver circuitry 215 downconverts the received signal 452 by subtracting the frequency signal from the oscillator 206, which introduces an oscillator error at time t (i.e., $f_e(t)$) into the downconverted signal 420. Thus, when the mobile terminal 310 is moving with respect to the communication systems 305, the downconverted signal 420 at time t may include a composite frequency error $R_x(t)=f_e(t)+f_d(t)$. The signal 450 may also include a message 450 from the communication system 305 at a time t within information provided by the communication system regarding the frequency error observed in signals received from the mobile terminal at a preceding time t=t−1. As such, processing the received and downconverted signal 420 enables the processor 208 to estimate the composite frequency error at time t (i.e., $R_x$ error (t)). Using these two pieces of information, the processor 208 is able to compute a frequency compensation factor to compensate for the Doppler shift as well as variations in the oscillator error the next time the mobile terminal 310 transmits a signal 443 to the communication system 305.

Due to instability or inaccuracy in the low-cost oscillator 206, the oscillator error $f_e(t)$ introduced in the downconversion at time t may be different from the oscillator error introduced in the downconversion at a prior time t−1. Therefore, regular or periodic updates to the frequency error compensation applied in uplink transmissions are needed to maintain a communication link in mobile terminals using such oscillators.

In the tracking mode of operation, the mobile terminal processor 208 may compensate for frequency errors in uplink transmissions as follows: (i) the estimated frequency error in the received signal is compensated with a minus sign $-R_x(t)=-f_e(t)-f_d(t)$ (which, as discussed earlier, corrects the Doppler error component but doubles the oscillator error component) and (ii) the doubled oscillator error component is corrected using the best available estimate of that component, which was previously communicated from the communication system at time t−1 that is, $2f_e(t-1)$. Thus, the total frequency compensation the processor 208 applies in the signal 430 to be transmitted equals $T_x$ correction $(t)=-R_x(t)+2f_e(t-1)$. Upconverting the signal 430 using frequency signals from the oscillator 206 removes the oscillator error at time t−1 but does not remove the oscillator drift that occurred between times t and t−1). More specifically, the upconverted message 443 may be transmitted at a frequency equal to the correct frequency $f_c$ minus the Doppler shift $f_d$, and minus the difference between the oscillator error of the current time t and the oscillator error at a previous time t−1 (i.e., $f_c-f_d(t)-2df_e(t)$, where $df_e(t)=f_e(t)-f_e(t-1)$). The mobile device 310 transmits this signal 443 to the communication system 305 where it is received as received signal 445. Although the received signal 445 incurs the Doppler shift $f_d(t)$ due to the movement of the mobile terminal 310 with respect to communication system 305, the Doppler shift compensation $-f_d(t)$ applied when generating the transmitted message 430 approximately cancels out that frequency error component. Thus, the communication system 305 will receive the signal 445 having a frequency approximately equal to the transmitted frequency minus twice the oscillator drift between times t and t−1, which will be the difference between the oscillator error of the second time and the oscillator error of the previous time (i.e., $f_c-2df_e(t)$, where $df_e(t)=f_e(t)-f_e(t-1)$.

If the oscillator has zero drift between successive uplink transmission instants, i.e., $df_e(t)=0$, then the signal 445 received by the communication system 305 would be at the correct frequency $f_c$. However, there will almost always be some oscillator frequency drift, and therefore some frequency error in the signal 445 observed by the communication system 305. Therefore, the communication system 305 may determine the frequency error in the signal 445, which will equal the difference between the correct frequency $f_c$ and the observed frequency. Again, the communication system 305 may employ a variety of methods and circuits to determine the frequency of signals received from the mobile terminal. The communication system 305 then includes information indicating the observed frequency error (i.e., $2df_e(t)$ in a subsequent message transmission 450 to the mobile terminal 310. Receiving this information will enable the mobile terminal processor 208 to update the frequency error compensation factor used for compensating for oscillator error in subsequent transmissions to the communication system 305.

Thus, the tracking mode 400 executing on the mobile terminal 310 updates the oscillator error compensation factor in an iterative manner based on frequency error feedback information received from the communication system 305, thereby enabling the communication link to remain in sync even if the oscillator error $f_{osc}$ varies with time (i.e., drifts). The tracking mode method also automatically accounts for variations in the magnitude of the Doppler shift in the estimation of the received signal frequency error $R_x$ error $(t)=f_e(t)+f_d(t)$. Thus, the tracking mode method accommodates changes over time in both the oscillator error and Doppler shift of the composite frequency error.

Since frequency error feedback information from the communication system 305 will be received by the mobile terminal 310 after a delay due to processing time and the round-trip time of the uplink and downlink signals, the mobile terminal oscillator 206 should be stable enough so that the oscillator frequency error does not change by more than the frequency tolerance or lock-in range (i.e. the frequency error that can be accommodated by receiver system) of the communication system 305 during such delay. In the case of a mobile terminal communicating with a geosynchronous satellite access point, the round-trip and processing delay between uplink and downlink communications may be 0.25 to 0.5 seconds. Thus, for satellite communication systems, the mobile terminal oscillator should be stable enough that the frequency error does not exceed the frequency tolerance of the satellite receiver within 0.5 seconds, for example.

The foregoing description ignores the contribution of errors in the estimate of frequency (i.e., "estimation errors") introduced in the circuitry of the communication system 305 and mobile terminal 310. While these errors may reduce the performance of the techniques described herein, they do not alter the approach or value of the techniques described herein. It is an engineering design task for the practitioner to contain the estimation errors within acceptable limits, either by designing sync signals with robust pilots, or by averaging more than one frequency measurement in the long loop operation.

FIGS. 3 and 4 illustrate components and methods for compensating for Doppler shift and oscillator frequency errors for the special case in which the uplink and downlink frequencies are the same. However, in some implementations the uplink and downlink frequencies are separated so that uplink and downlink channels can be used simultaneously. For example, a satellite-based communication system and mobile terminal may communicate using an uplink frequency of 30 GHz and a downlink frequency of 20 GHz.

As discussed above with reference to FIG. 2, a mobile terminal may use the same oscillator for both downconverting downlink signals at one frequency and upconverting the uplink signals to another by using a circuit that applies a scaling factor r to the oscillator signal to generate the frequency signal used in upconverting uplink transmissions, in which the scaling factor r is equal to the ratio of the uplink frequency to the downlink frequency. Any of a variety of circuits for multiplying the frequency of an oscillator signal by a scaling factor r may be used. Using the same oscillator for both downlink downconversion and uplink upconversion in this manner introduces coherent oscillator drift as described and addressed above with reference to FIGS. 3 and 4.

Figure 5:
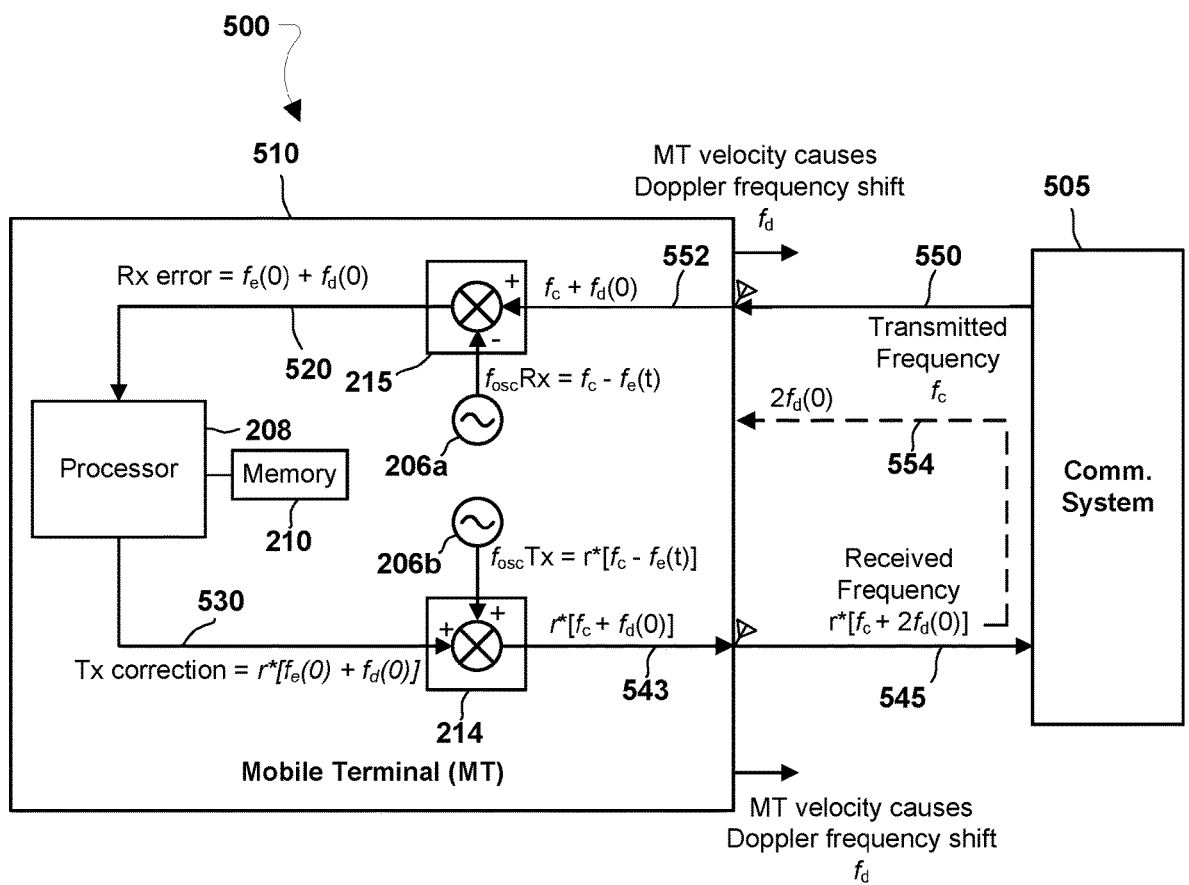
FIG. 5 is a block diagram illustrating components, signals, and frequency error components in an acquisition mode of a mobile terminal in which uplink and downlink frequencies are different according to various embodiments.

FIG. 5 is a block diagram illustrating components, messages and frequency error components in an acquisition mode 500 of a mobile terminal in which the uplink and downlink frequencies differ according to various embodiments. With reference to FIG. 5, in the acquisition mode 500, a mobile terminal 510 (e.g., the mobile terminal 130-1) may communicate with a communication system 505 (e.g., the ground station 125, the SAN 115, and the satellite 105).

The mobile terminal 510 may include receiver circuitry 215, transmit circuitry 214, two RF oscillators 206a, 206b and a processor 208. The two RF oscillators are driven by the same oscillator (not shown) and as a result their phase noise and frequency drift are coherent. The receiver circuitry 215 may downconvert a received RF signal 552 that includes a Doppler shift $f_d(t)$ using signals from the oscillator 206 to generate a downconverted signal 520. Thus, the downconverted signal 520 includes both a Doppler shift $f_d(t)$ and a frequency error $f_e(t)$ from the oscillator 206 introduced during downconversion in the receiver circuitry 215.

Figure 6:
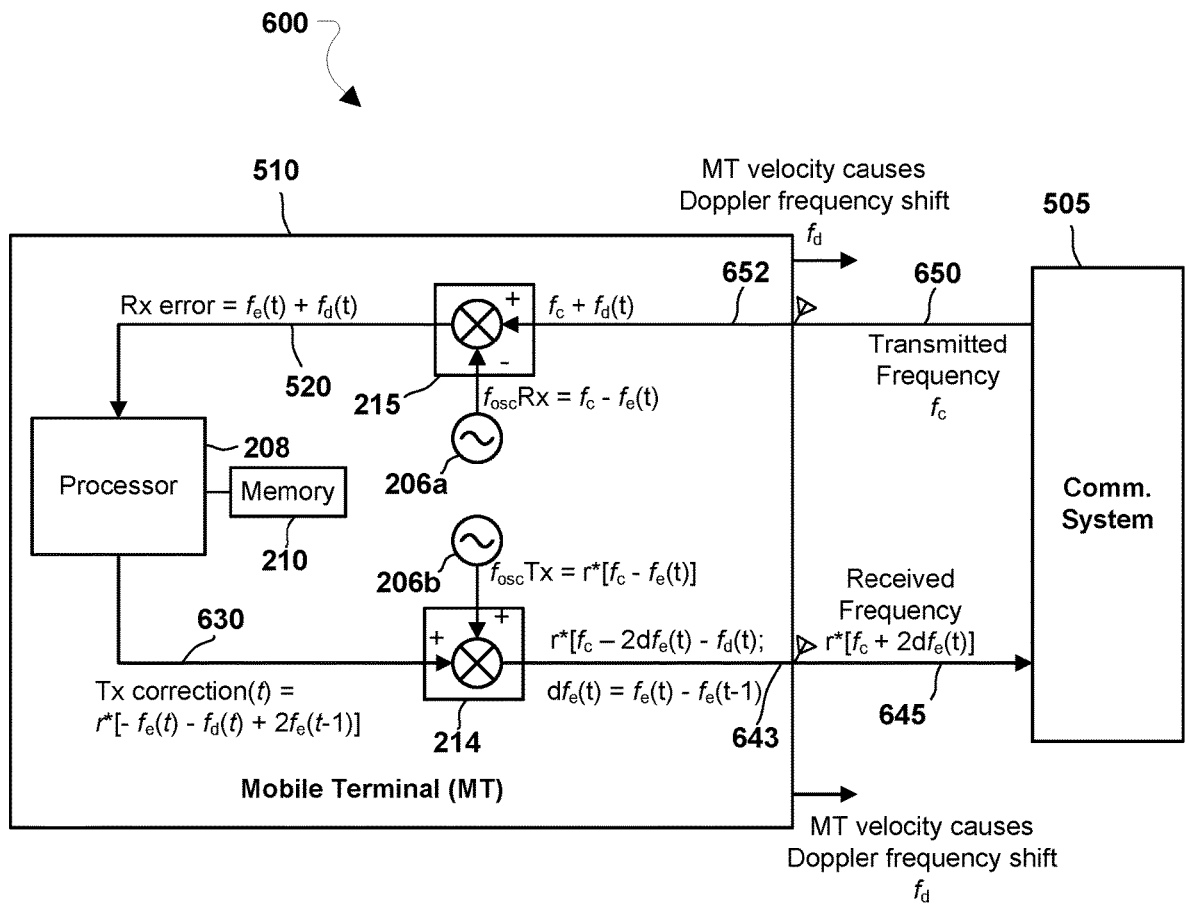
FIG. 6 is a block diagram illustrating components, signals, and frequency error components in a tracking mode of a mobile terminal in which uplink and downlink frequencies are different according to various embodiments.

In the embodiments illustrated in FIGS. 5 and 6, the uplink frequency used in transmissions by the mobile terminal 510 and the downlink carrier frequency used in transmissions by the communication system 505 are different. For example, the uplink frequency may be 30 GHz and the downlink frequency may be 20 GHz for a geostationary communication satellite, but this is not a limitation, and the forward downlink and return uplink signals may use any frequency or range of frequencies. A relationship between the uplink frequency and the downlink frequency may be represented by a scaling factor r. In some embodiments, the scaling factor may be a ratio of the uplink frequency to the downlink frequency (e.g., r=30 GHz/20 GHz=1.5).

Similar to the acquisition mode discussed above with reference to FIG. 3, in the acquisition mode, the mobile terminal 510 determines the Doppler shift through an exchange of signals with the communication system 505 that informs the mobile terminal about the frequency error related to the Doppler shift observed by the communication system 505.

The communication system 505 transmits sync (or other) signals at the downlink carrier frequency $f_c$, which the mobile terminal 510 observes to be Doppler shifted due to the motion of the mobile terminal 510 relative to the communication system 505. Thus, the received sync signal 552 has a frequency equal to the transmitted frequency $f_c$ plus the Doppler shift $f_d(0)$. The receive circuitry 215 downconverts the sync signal using signals from the downlink RF frequency oscillator 206a, introducing an oscillator error $f_e(0)$. Again, the oscillator error may be expressed as $f_{osc,RX}=f_c-f_e(0)$, where $f_{osc,RX}$ represents the downlink frequency of the received message $f_c$ less the oscillator error at the first time $f_e(0)$. The receiver circuitry 215 may pass the downconverted sync signal 520 to the processor 208 with a composite frequency error ($R_x$ error(0)) that includes a Doppler shift and an oscillator error (i.e., Rx error(0)=$f_e(0)$+ $f_d(0)$). The processor estimates the frequency of the downconverted sync signal 520 and thus determines the composite frequency error in the sync signal ($R_x$ error(0)) using frequency estimation methods and/or circuits such as those discussed above. Additionally, the processor 208 may estimate the composite frequency error for a number of sync signals and average the results to reduce estimation errors. The processor 208 may store the sync signal composite frequency error ($R_x$ error(0)) in memory 210.

As discussed above, the mobile terminal 510 may operate in the acquisition mode searching for the sync signal within a range of frequencies to accommodate the Doppler shift and various target frequencies until sync signal from the communication system 505 are recognized, thus enabling the mobile terminal to determine the sync signal composite frequency error ($R_x$ error(0)).

In response to recognizing the sync signals, the processor 208 may generate a reply signal 530 to be transmitted to the communication system 505 that includes an error correction equal to the determined composite frequency error ($R_x$ error) multiplied by a scaling factor r that is the ratio of the uplink to downlink frequencies. Again, adding the composite frequency error ($R_x$ error) to the reply signal frequency will double the Doppler shift observed by the communication system 505, but such an error is likely to be significantly smaller, and thus more likely to fall within the lock-in range, than would be the case in subtracting the composite error which would double the oscillator frequency error. The transmitter circuitry 214 upconverts the reply signal using a frequency signal received from the uplink oscillator 206b to generate the transmitted reply signal 543. In doing so, the oscillator error is approximately canceled out so the transmitted reply signal 543 has a frequency equal to the ratio r of the uplink to downlink frequencies times the sum of the downlink frequency $f_c$ plus the Doppler shift $f_d(0)$.

The transmitted reply signal 543 incurs the same Doppler shift due to motion of the mobile terminal 510, so the communication system 505 receives the reply signal 545 with a frequency at the correct uplink frequency $r*f_c$ plus twice the Doppler shift $r*f_d$. Thus, when expressed in terms of the downlink carrier frequency $f_c$, the reply signal 545 is received by the communication system 505 has a frequency equal to $r[f_c+2f_d(0)]$. The communication system 505 may determine the frequency error in the received signal, which will be approximately twice the Doppler shift at the initial time (e.g., $2f_d(0)$), and send message 554 indicating the Doppler shift $f_d(0)$. As discussed above, the communication system 505 may employ a variety of methods and circuits to determine the frequency of signals, and thus the frequency error, received from the mobile terminal 510. The manner in which the message 554 indicates the calculated Doppler shift $f_d(0)$ can vary from embodiment to embodiment. In some embodiments, the communication system 505 may send a message 554 to the mobile terminal 510 that identifies the observed frequency error or the Doppler shift. In some embodiments, the communication system 505 may send a message 554 to the mobile terminal 510 that identifies the total residual frequency error, from which the mobile terminal can calculate the Doppler shift by dividing by 2. In various embodiments, the communication system 505 may transmit the message 554 with the Doppler shift information as data using in-channel signaling.

Having obtained the Doppler shift $f_d(0)$ in the acquisition mode, the mobile terminal 510 may store the Doppler shift information in memory 210. Learning the initial Doppler shift $f_d(0)$ in the sync and reply signal exchanges from the communication system (i.e., at a first time t=0) and having determined and stored in memory the sync signal composite frequency error, $R_x = f_d(0) + f_e(0)$, the processor 208 is able to use subtraction to estimate the oscillator error component $f_e(0)$ within the composite frequency error in the sync signal. Thus, at this point the processor knows the composite frequency error $R_x = f_d(0) + f_e(0)$ from processing the signal 550 and an estimate of the oscillator error component during the preceding exchange of sync and reply signals (i.e., at the first time t=0). With this information, the mobile terminal processor 208 is able to estimate the oscillator error based on the composite frequency error (Rx error) determined from received signals, and therefore may enter the tracking mode that is described below with reference to FIG. 6 for embodiments in which the uplink and downlink frequencies differ by the scaling factor r.

FIG. 6 is a block diagram illustrating components, messages and frequency error components in a tracking mode of a mobile terminal using different uplink and downlink frequencies according to various embodiments. In the tracking mode 600, the mobile terminal uses frequency error information included in messages received from the communication system 505 to determine and update a frequency error compensation factor to accommodate frequency errors introduced by an oscillator (not shown) of the mobile terminal 510. In some embodiments, the mobile terminal 510 may track the Doppler shift by receiving frequency error data from the communication system 505 via the long loop, determining the oscillator drift, adjusted by the frequency correction factor for uplink transmissions, and transmitting uplink signals to the communication system 505 that subtract the Doppler shift and account for oscillator drift in a closed loop manner.

Operating in the tracking mode, the mobile terminal 510 receives messages within signals from the communication system 505 at various times t. Similar to the discussion above with reference to FIG. 4, the communication system 505 transmits signals 650 having a frequency of $f_c$ which are observed upon reception to be frequency shifted by the Doppler shift $f_d(t)$ caused by relative motion of the mobile terminal 510 with respect to the communication system 505. Thus, received signals 652 at the mobile terminal 510 have have a frequency of $f_c + f_d(t)$. When received signals 652 are downconverted by the receiver circuitry 215, an oscillator error $f_e(t)$ is introduced into the downconverted signals 520, resulting in a total receive error of $f_e(t) + f_d(t)$. Due to instability or inaccuracy in the oscillator (i.e., oscillator drift), the oscillator error $f_e(t)$ introduced in the downconversion may vary over time.

In the tracking mode of operation, the mobile terminal processor 208 may compensate for Doppler shift when transmitting to the communication system 505 by applying a transmit frequency compensation factor that is the negative of the composite frequency error estimated by the processor in the receive direction (adjusted for the frequency ratio of the transmit and receive directions), namely $-rR_x(t)$. Similar to the embodiment described with reference to FIG. 4, this will result in the eventual correction of the Doppler component of the error as observed by the communication system 505 but will introduce twice the oscillation error. In order to address this latter error, the processor 208 further compensates the transmit frequency by the best estimate available for this error, which is the preceding oscillator error at the previous time instant t−1, namely $2rf_e(t-1)$. Thus, the total compensation factor in the transmit direction is $Tx_{correction}(t) = -rR_x(t) + 2rf_e(t-1) = r[-f_e(t) - f_d(t) + 2f_e(t-1)]$.

The mobile terminal processor 208 may prepare a signal 630 for transmission to the communication system 505 having transmit frequency compensation $Tx_{correction}(t) = r[-f_e(t) - f_d(t) + 2 f_e(t-1)]$. The transmitter circuitry 214 may upconvert the signal 530 to the transmission frequency $rf_c$ using a frequency signal from the uplink RF oscillator 206b, which is equal to the downlink frequency scaled by the scaling factor r. Upconverting introduces the oscillator error $rf_e(t)$ into the message, which approximately cancels the $-rf_e(t-1)$ compensation component. Thus, the transmitted message 643 has frequency equal to $r[f_c - f_d(t) + 2df_e(t)]$, where $df_e(t) = f_e(t) - f_e(t-1)$).

The transmitted signal 643 incurs the Doppler shift $rf_d(t)$ due to mobility of the mobile terminal 510, which is approximately canceled by the $-rf_d(t)$ component of the transmit frequency correction. Thus, the communication system 505 may receive the uplink signal 645 with a frequency equal to the transmitted frequency minus twice the difference of the oscillator error of the current time and the oscillator error of the previous time, scaled by the scaling factor r (i.e., $r[f_c + 2df_e(t)]$, where $df_e(t) = f_e(t) - f_e(t-1)$).

If the oscillator drift were zero (i.e., $r2df_e(t) = 0$, the received signal 645 would have the correct frequency $f_c$. However, there can be some oscillator drift with time. Therefore, the communication system 505 may determine the residual frequency error in the received signal 645, which will equal the difference between the correct frequency $f_c$ and the observed frequency. Again, the communication system may employ a variety of methods and circuits to determine the frequency of the received reply signal, including digital estimation methods, maximum likelihood methods, joint phase, frequency and data detection, and specially designed PLLs. The communication system 505 then indicates the residual frequency error (i.e., $r2df_e(t)$) in a subsequent message within subsequent signal 650 to the mobile terminal 510. In some embodiments, the communication system 505 may send to the mobile terminal 510 a message including the residual frequency error via the forward downlink signal 650, such as via in-channel signaling. The frequency error information $r2df_e(t)$ within the message will enable the mobile terminal processor 208 to update the frequency error compensation factor used for generating messages for subsequent transmissions to the communication system 505 (i.e., the received frequency error information from the last transmission is treated as the time t−1 factor in the Tx correction(t)=$r[-R_x(t) + 2f_e(t-1)]$.

The exchange of signals and messages between the mobile terminal 510 and the communication system 505 including reporting of observed frequency errors thus enables the mobile terminal processor 208 to iteratively adjust the frequency compensation factor used in uplink transmissions in a closed-loop fashion. This enables the mobile terminal 510 and the communication system 505 to maintain a high bandwidth communication link despite frequency variations in the mobile terminal oscillator 206. As discussed above, the processing and round-trip time for messages in the tracking mode may result in a long feedback loop when the mobile terminal 510 and communication system 505 are far apart, as in the case of geosynchronous satellite communication systems.

Figure 7:
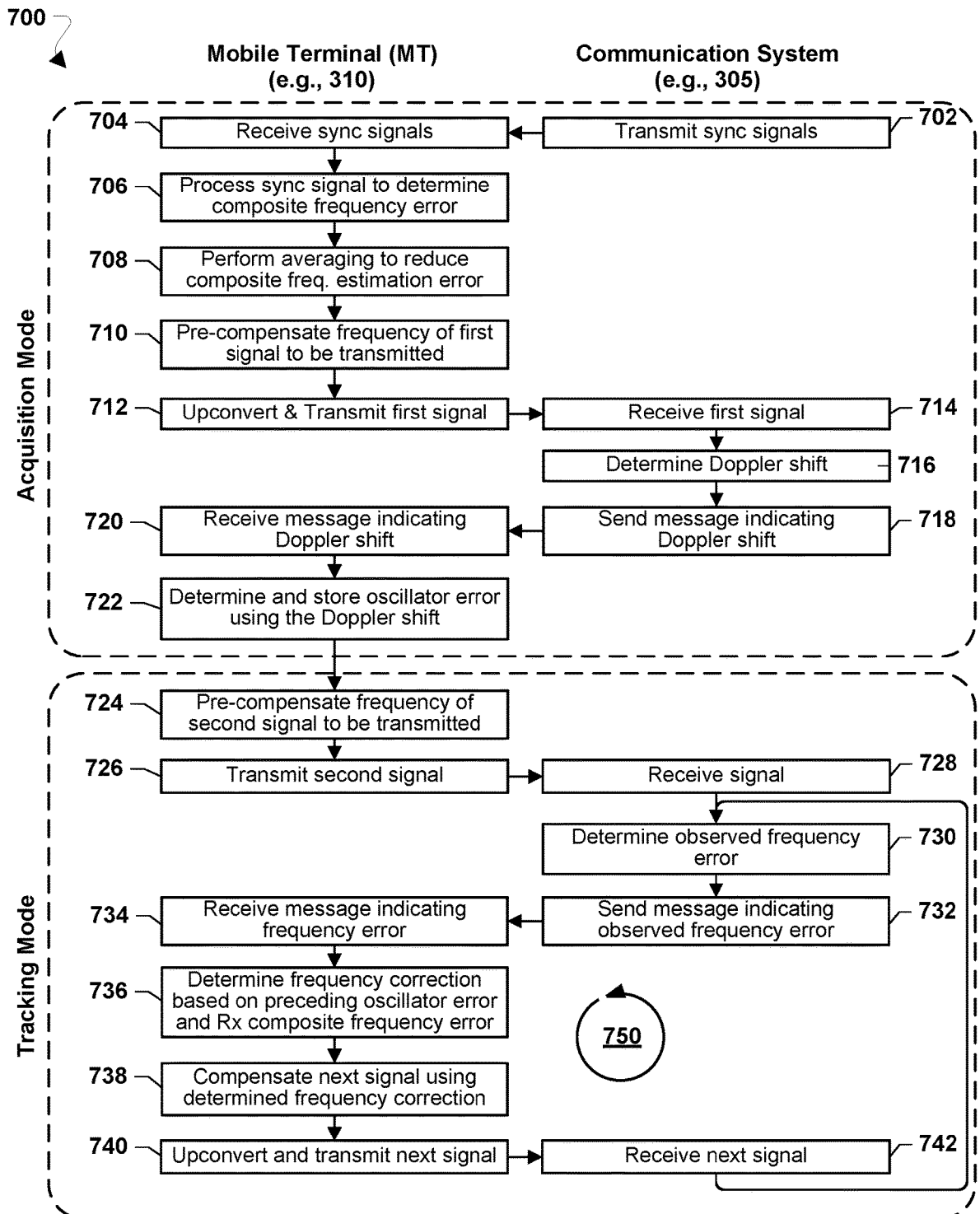
FIG. 7 is a process flow diagram illustrating a method of frequency compensation in a communication system according to various embodiments.
Figure 8:
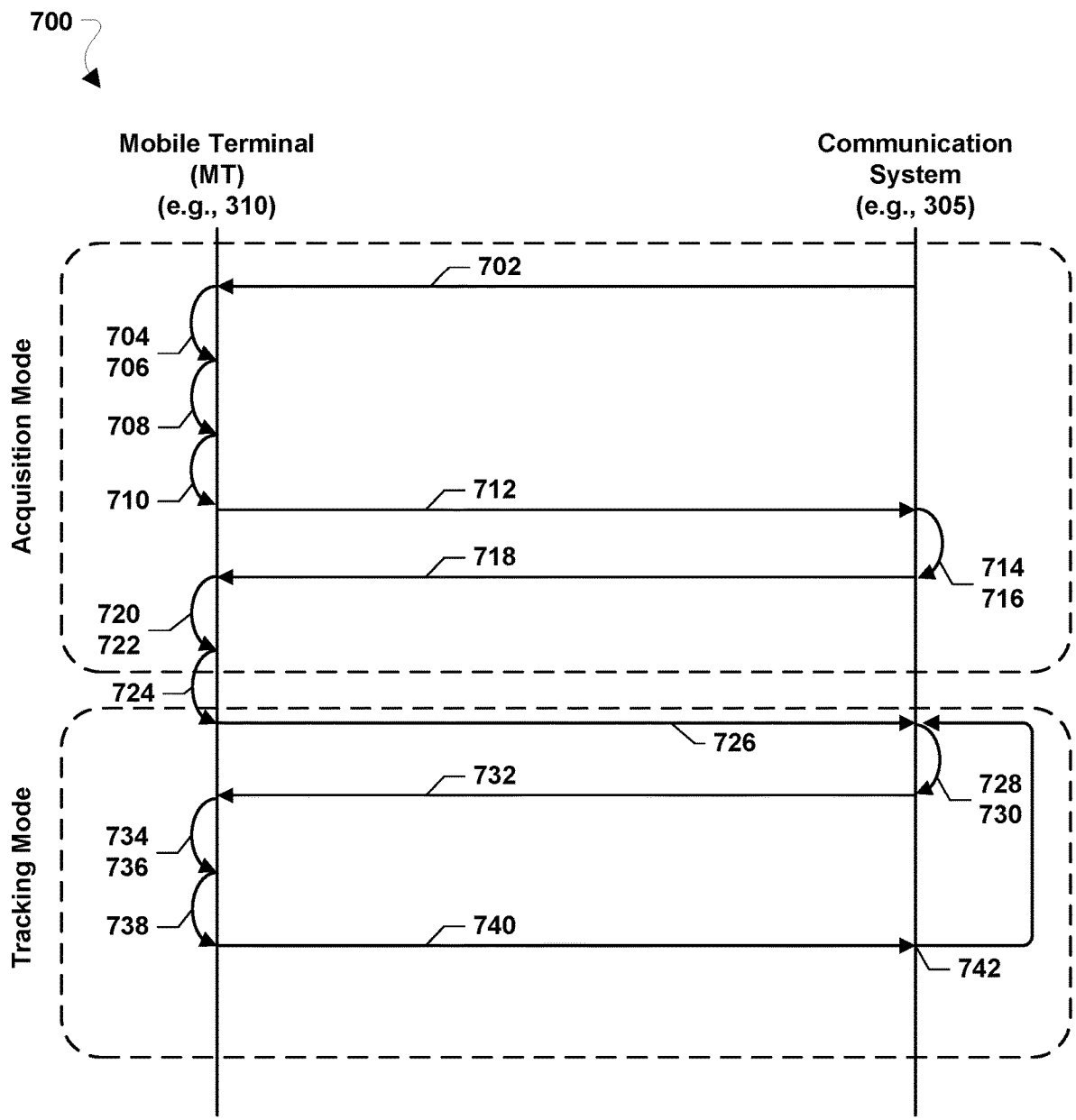
FIG. 8 is a message flow diagram illustrating a method of frequency compensation in a communication system according to various embodiments.

FIG. 7 is a process flow diagram and FIG. 8 is a message flow diagram, which together illustrate a method 700 of frequency correction in a high bandwidth, high carrier frequency communication system according to various embodiments in which uplink and downlink signals are transmitted at the same frequency. With reference to preceding FIGs., the method 700 may be implemented by a processor (e.g., processor 208) of a mobile terminal (e.g., mobile terminal 310) and a processor of the communication system (e.g., communication system 305).

In block 702, the communication system may transmit sync (or other) signals that enable terminals, including mobile terminals, to identify and acquire a communication link with the communication system. The sync signals may be transmitted at a frequency and with a pattern that terminals are configured to look for when attempting to initiate a communication link with the communication system.

Upon power up or other initialization, a mobile terminal may begin operating in an acquisition mode. As described above, the mobile terminal may begin monitoring for the sync signals transmitted by the communication system, such as by monitoring the known frequency for signals matching the sync signal pattern. To accommodate Doppler shift and oscillator errors, the mobile terminal may monitor a band of frequencies about the known frequency of the sync signals.

In block 704, mobile terminal may receive a sync signal from the communication system 305.

In block 706, a processor of the mobile terminal may process the received sync signal to determine a composite frequency error between the frequency of the received and processed sync signals and the known frequency of such signals. The composite frequency error will include both an oscillator error due to an oscillator of the mobile terminal and a Doppler shift due to relative motion of the mobile terminal with respect to the communication system. The processor may store the determined composite frequency error in memory as part of the operations in block 706.

In block 708, in some embodiments, the processor of the mobile terminal may perform averaging on received sync signals to reduce the frequency estimation error.

In block 710, the mobile terminal may generate an acquisition reply signal (referred to herein as a "first signal") for transmission that includes a pre-compensation that adds the determined composite frequency error. In block 712, the mobile terminal upconverts the first signal (e.g., a reply signal) that the mobile terminal transmits to the communication system in block 712. As upconverting the first signal will compensate for the oscillator frequency error component, the first signal will be transmitted at a frequency that includes the Doppler shift. As discussed above, adding the determined composite frequency error (vs. subtracting) in blocks 710 and 712 will double the Doppler shift observed by the communication system but approximately or completely cancel the potentially larger oscillator component, thus increasing the likelihood that the first signal will be received with a frequency within the lock-in band of the communication system.

In block 714, the communication system may receive the first signal, and determine a frequency error as the difference between the received signal frequency and the expected frequency of a reply signal in block 716. Receiver circuitry in the communication system may estimate the frequency, and thus frequency error, in the received first signal using any of a number of methods and circuits discussed herein. As the first signal included the Doppler shift due to pre-compensation and accumulated a further Doppler shift due to relative movement of the mobile terminal, the amount of frequency error observed by the communication system will be approximately double the Doppler shift. In some embodiments, the communication system may determine the Doppler shift in the received first signal based on the determined frequency error in block 716, such as by dividing by 2.

In block 718, the communication system may send a message to the mobile terminal including information regarding the Doppler shift or the observed frequency error from which the mobile terminal can determine the Doppler shift.

In block 720, the mobile terminal may receive, downconvert and process the signal carrying the message from the communication system to obtain the information regarding the Doppler shift or the frequency error observed by the communication system.

In block 722, the mobile terminal processor may use the information received in block 720 to determine the Doppler shift at the time that the sync signal or signals were received and determine the oscillator error by subtracting the Doppler shift from the composite frequency error in the received signal. The processor may store the determined oscillator error component in memory as the preceding frequency error for use in an initial iteration of the tracking mode.

Having determined the preceding oscillator error in the signal that was previously processed (at time t=0), the mobile terminal may enter a tracking mode and begin receiving messages and signals from and transmitting signals to the communication system. In an initial iteration in block 724, the processor may generate a second signal for transmission at a frequency pre-compensated for Doppler shift based on the preceding frequency error $f_e(0)$ determined and stored in block 722. As described above, this pre-compensation recalls from memory and uses the preceding frequency error $f_e(0)$ determined in block 722 to adjust the frequency by a transmission correction factor $T_x$ correction (t)=$-R_x(1)+2f_e(0)$, in which $-R_x(1)$ is the composite frequency error determined by the processor present in the signal received from the communication system in block 720 and determined in block 722, and $f_e(0)$ is the frequency error calculated by subtracting the determined Doppler shift from the composite frequency error determined by the processor from the sync signal.

In block 726, the mobile terminal may upconvert and transmit the generated signal to the communication system. As described, the pre-compensation subtracts the Doppler shift from the transmission frequency and compensates for the preceding oscillator frequency error.

In block 728, the communication system may receive the signal from the mobile terminal and determine an observed frequency error based on processing the received signal in block 730. Because the mobile terminal subtracted the determined Doppler shift from the message transmitted in blocks 724 and 726, the observed frequency error will be the mobile terminal oscillator error that was not cancelled during upconversion of the signal in the mobile terminal. In other words, the observed frequency error is due to the difference (drift) between the oscillator error at the time the second signal was generated and transmitted, and the preceding oscillator error used to do the frequency compensation. In some embodiments, the observed frequency error may be twice the difference (i.e., drift) in the oscillator error at time t=0 when the sync signal or signals were received and the time t=1 when the signal sent in block 726 was transmitted by the mobile terminal.

In block 732, the communication system may send a message to the mobile terminal including information regarding the observed frequency error. The information regarding the observed frequency error may be transmitted in the same downlink channel as all other communication data (i.e., not in another control channel).

In block 734, the mobile terminal may receive the message including the information indicating the frequency error observed by the communication system in the second signal transmitted in block 726.

In block 736, the mobile terminal may determine a frequency error correction factor based on the received information regarding the preceding oscillator error reported by the communication system (i.e., in the message within the signal sent in block 732) and the composite frequency error (i.e., $R_x$ error) observed by the mobile terminal processor in the signal encoding the message. The mobile terminal may then use this information to update the preceding oscillator error stored in memory for frequency compensation of the next transmit signal. Notationally, the preceding oscillator error reported by the communication system in the message sent in block 732 is referred to herein as $f_e(t-1)$ because that frequency error was observed in the preceding signal from the mobile terminal, while the composite frequency error is referred to as the frequency error at time t or $R_x$ error (t). As described above, the transmit frequency correction is equal to the negative of the current composite frequency error of the message received from the communication system plus two times the preceding frequency error reported by the communication system in that message, or $T_{x_{correction}}(t) = -R_x(t) + 2 f_e(t-1)$. Again, $R_x(t) = f_e(t) + f_d(t)$. By subtracting the currently determined composite frequency error determined in block 736, the Doppler shift and the preceding oscillator error are removed from the transmitted signal, thus compensating for changes in Doppler shift over time.

In block 738, the mobile terminal may generate the next signal to be transmitted to the communication system that includes adjusting the frequency by the determined frequency correction (i.e., compensates for the oscillator frequency error and the Doppler shift), and upconvert and transmit the second signal to the communication system in block 740.

In block 742, the communication system may receive the next signal from the mobile terminal, and again perform the operations of blocks 730, 732, and 742 to determine and report the observed frequency error to the mobile terminal in a message included within downlink signals.

In blocks 734-740, the mobile terminal may again receive the information regarding the frequency error observed by the communication system and estimate the composite frequency error in block 734, update the frequency error correction factor based on the latest frequency error information in block 736 (i.e., determining $T_x$ correction (t)=−$R_x$(t)+2$f_e$ (t−1) in which t is incremented from the last), generate another signal for transmission that includes the updated frequency correction in block 738, and upconvert and transmit the signal to the communication system in block 740.

The operations in blocks 730-742 may continue to be performed by the mobile terminal and the communication system periodically in a feedback loop 750 throughout a communication session to compensate for oscillator drift as well as Doppler shift in the mobile terminal oscillator.

Figure 9:
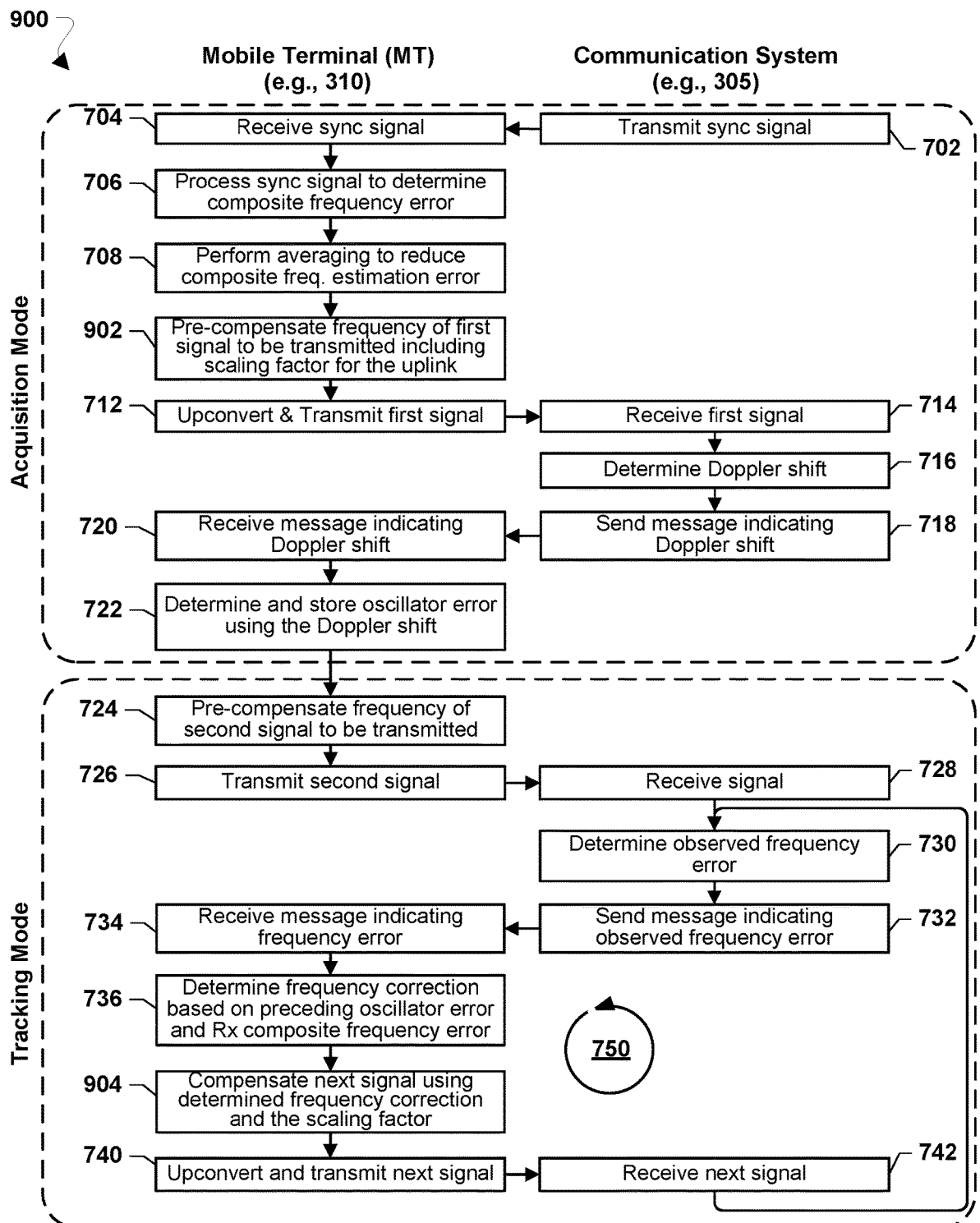
FIG. 9 is a process flow diagram illustrating a method of frequency compensation in a communication system in which uplink and downlink frequencies are different according to various embodiments.
Figure 10:
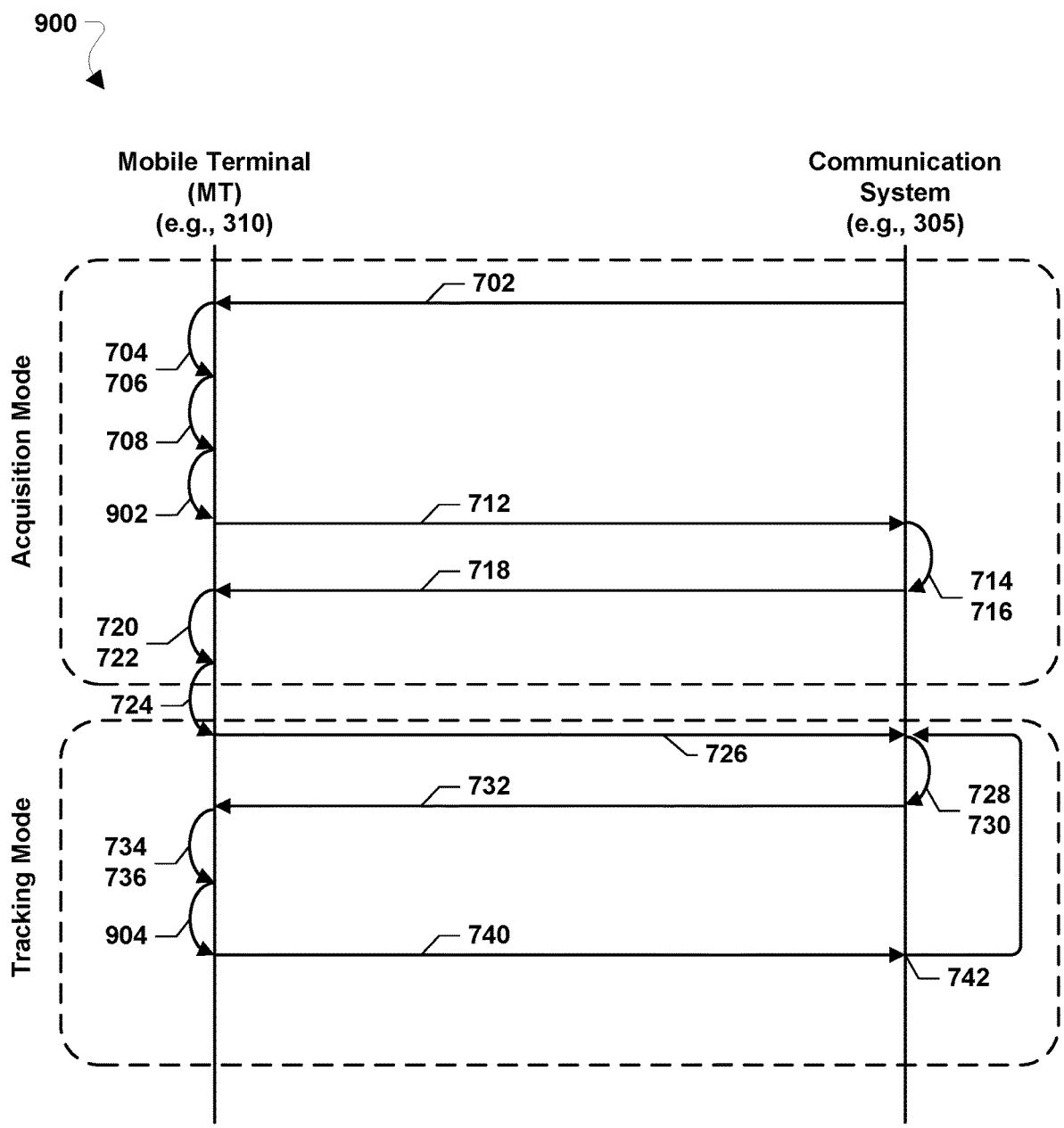
FIG. 10 is a message flow diagram illustrating a method of frequency compensation in a communication system according to various embodiments.

FIG. 9 is a process flow diagram and FIG. 10 is a message flow diagram, which together illustrate a method 900 of frequency correction in a high bandwidth, high carrier frequency communication system in which uplink and downlink communications are transmitted on different frequencies according to various embodiments. With reference to preceeding FIGs., the method 900 may be implemented by a processor (e.g., processor 208) of a mobile terminal (e.g., mobile terminal 510) and a processor of the communication system (e.g., communication system 505) in which the uplink frequency and downlink used by the mobile terminal and the communication system are different. The ratio of the uplink frequency to the downlink frequency may be represented by a scaling factor r.

In blocks 702-742, the mobile terminal and the communication system may perform operations similar to those described above for like-numbered blocks of the method 700, with the exception of blocks 902 and 904. In block 902, when operating in the acquisition mode, the processor of the mobile terminal may pre-compensate the frequency for transmitting the acquisition reply (i.e., first) signal by adding the composite frequency error (which includes the oscillator error and the Doppler shift) determined by the processor from the received sync signal (determined in blocks 706, 708), times the scaling factor r. Similarly when operating in the tracking mode, in block 904 the processor of the mobile terminal may pre-compensate for frequency errors when generating a second signal to be sent to the communication system using the determined frequency correction times the scaling factor r in block 904 using the formula:

$$Tx \text{ correction } (t) = -rR_x(t) + 2rf_e(t-1) = r[-f_e(t) - f_d(t) + 2f_e(t-1)]).$$

Other than accommodating different uplink and downlink frequencies via the scaling factor r, the operations of the method 900 may proceed in a manner substantially similar to that described with reference to FIGS. 7 and 8.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 300, 400, 500, 600, 700, and 900 may be substituted for or combined with one or more operations of the methods 300, 500, 600, 700, and 900, and vice versa. Although a process may be described as a sequential process, in some embodiments operations may be performed in parallel or concurrently. In some embodiments, the order of operations may be rearranged.

The foregoing method descriptions and the process flow diagrams are provided merely as illustrative examples and are not intended to require or imply that the blocks of various embodiments must be performed in the order presented. As will be appreciated by one of skill in the art the order of blocks in the foregoing embodiments may be performed in any order. Words such as "thereafter," "then," "next," etc. are not intended to limit the order of the blocks; these words are simply used to guide the reader through the description of the methods. Further, references separate identifiers of signals (e.g., such as first, second, third, etc.) in the descriptions and the claims are for reference purposes and in various embodiments such signals may be the same or similar. Additionally, any reference to claim elements in the singular, for example, using the articles "a," "an" or "the" is not to be construed as limiting the element to the singular.

The various illustrative logical blocks, modules, circuits, and algorithm blocks described in connection with the embodiments disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of communication devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In various embodiments, the functions described may be implemented in hardware, software, firmware, or any combination thereof. If implemented in software, the functions may be stored as one or more instructions or code on a non-transitory computer-readable medium or non-transitory processor-readable medium. The operations of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, or other storage devices, or any other medium that may be used to store desired program code in the form of instructions or data structures and that may be accessed by a computer. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The terms "component," "module," "system," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a computing device and the computing device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known computer, processor, and/or process related communication methodologies.

The preceding description of the disclosed embodiments is provided to enable any person skilled in the art to make or use the present embodiments. Various modifications to these embodiments will be readily apparent to those skilled in the art, and the generic principles defined herein may be applied to other embodiments without departing from the spirit or scope of the embodiments. Thus, various embodiments are not intended to be limited to the embodiments shown herein but are to be accorded the widest scope consistent with the following claims and the principles and novel features disclosed herein.

What is claimed is:

1. A method of frequency correction in a mobile terminal, the method comprising:
    receiving, by the mobile terminal, a first receive signal from a communication system;
    operating the mobile terminal in an acquisition mode, comprising:
        processing, by the mobile terminal, the first receive signal to determine a first receive frequency error;
        determining a first frequency correction by applying a first correction procedure to the first receive frequency error, wherein the first correction procedure compensates for a first oscillator error within the first receive frequency error due to an oscillator in the mobile terminal;
        transmitting a first transmit signal that is frequency-corrected by the first frequency correction;
        receiving, by the mobile terminal, a first message from the communication system, the first message indicating a first Doppler shift of the first receive frequency error as determined by the communication system using the first transmit signal;
        determining, by the mobile terminal, the first oscillator error based on the first receive frequency error and the first Doppler shift; and
        storing the determined first oscillator error as a preceding oscillator error; and
    switching operation of the mobile terminal from the acquisition mode to a tracking mode, the tracking mode comprising iteratively performing operations comprising:
        processing a second receive signal received from the communication system to determine a second receive frequency error, the second receive frequency error including a second oscillator error due to the oscillator and a second Doppler shift;
        determining a second frequency correction by applying a second correction procedure to the second receive frequency error, wherein the second correction procedure compensates for the preceding oscillator error and the second Doppler shift;
        transmitting a second transmit signal to the communication system that is frequency-corrected by the second frequency correction; and
        updating the stored preceding oscillator error based on a subsequent message received from the communication system, the subsequent message indicating a difference between the second oscillator error and the preceding oscillator error that was determined by the communication system using the second transmit signal.

2. The method of claim 1, wherein the first correction procedure maintains the first Doppler shift of the first receive frequency error.

3. The method of claim 1, wherein the second correction procedure applied to the second receive frequency error is opposite the first correction procedure applied to the first receive frequency error.

4. The method of claim 1, wherein a transmission frequency of the first transmit signal that is frequency-corrected by the first frequency correction includes the first Doppler shift present in the first receive signal.

5. The method of claim 1, wherein the first correction procedure comprises adding the determined first receive frequency error to a baseband signal prior to upconverting to a transmission frequency to form the first transmit signal.

6. The method of claim 1, wherein the first receive signal is a sync signal broadcast by the communication system.

7. The method of claim 1, wherein the second correction procedure comprises subtracting the determined second receive frequency error from a baseband signal and adding twice the preceding oscillator error prior to upconverting to a transmission frequency to form the second transmit signal.

8. The method of claim 1, wherein the transmitting the second transmit signal that is frequency corrected by the second frequency correction comprises adjusting a baseband signal by the second frequency correction and upconverting the adjusted baseband signal using a frequency signal from the oscillator.

9. The method of claim 1, wherein a carrier frequency of signals received from the communication system differs from a carrier frequency of signals transmitted from the mobile terminal by a ratio r, and wherein:
the first correction procedure comprises determining the first frequency correction as the first receive frequency error;
transmitting the first transmit signal that is frequency-corrected by the first frequency correction comprises upconverting a first baseband signal that includes the first frequency correction using a frequency signal from the oscillator increased by the ratio r;
the second correction procedure comprises determining a frequency correction that multiplies by the ratio r a sum of twice the preceding oscillator error minus the determined second receive frequency error; and
transmitting the second transmit that is frequency-corrected by the second frequency correction comprises upconverting a second baseband signal that includes the second frequency correction using the frequency signal from the oscillator increased by the ratio r.

10. A mobile terminal, comprising:
an oscillator;
a receiver circuit configured to downconvert signals received from a communication system using a frequency signal from the oscillator;
a transmit circuit configured to upconvert a baseband signal to a transmission frequency using the frequency signal from the oscillator;
a memory;
a processor coupled to the receive circuit, the transmit circuit and the memory; and
instructions stored in the memory and executable by the processor to:
receive from the receiver circuit a downconverted first receive signal received from the communication system;
operate in an acquisition mode comprising:
processing the first receive signal to determine a first receive frequency error;
determining a first frequency correction by applying a first correction procedure to the first receive frequency error, wherein the first correction procedure compensates for a first oscillator error within the first receive frequency error due to the oscillator;
transmitting to the communication system via the transmit circuit a first transmit signal that is frequency-corrected by the first frequency correction;
receiving a first message from the communication system, the first message indicating a first Doppler shift of the first receive frequency error as determined by the communication system using the first transmit signal;
determining the first oscillator error based on the first receive frequency error and the first Doppler shift; and
storing the determined first oscillator error as a preceding oscillator error; and
switching operation from the acquisition mode to a tracking mode, the tracking mode comprising iteratively performing operations comprising:
processing a second receive signal received from the communication system after downconversion by the receiver circuit to determine a second receive frequency error, the second receive frequency error including a second oscillator error due to the oscillator and a second Doppler shift;
determining a second frequency correction by applying a second correction procedure to the second receive frequency error, wherein the second correction procedure compensates for the preceding oscillator error and the second Doppler shift;
transmitting via the transmit circuit a second transmit signal to the communication system that is frequency-corrected by the second frequency correction; and
updating the stored preceding oscillator error based on a subsequent message received from the communication system, the subsequent message indicating a difference between the second oscillator error and the preceding oscillator error that was determined by the communication system using the second transmit signal.

11. The mobile terminal of claim 10, wherein the first correction procedure maintains the first Doppler shift of the first receive frequency error.

12. The mobile terminal of claim 10, wherein the second correction procedure applied to the second receive frequency error is opposite the first correction procedure applied to the first receive frequency error.

13. The mobile terminal of claim 10, wherein a transmission frequency of the first transmit signal that is frequency-corrected by the first frequency correction includes the first Doppler shift present in the first receive signal.

14. The mobile terminal of claim 10, wherein the first correction procedure comprises adding the determined first receive frequency error to the baseband signal prior to upconverting to the transmission frequency to form the first transmit signal.

15. The mobile terminal of claim 10, wherein the first receive signal is a sync signal broadcast by the communication system.

16. The mobile terminal of claim 10, wherein the second correction procedure comprises subtracting the determined second receive frequency error from the baseband signal and adding twice the preceding oscillator error prior to upconverting to the transmission frequency to form the second transmit signal.

17. The mobile terminal of claim 10, wherein the transmitting the second transmit signal that is frequency corrected by the second frequency correction comprises adjusting the baseband signal by the second frequency correction and upconverting the adjusted baseband signal using the frequency signal from the oscillator.

18. The mobile terminal of claim 10, wherein a carrier frequency of signals received from the communication system differs from a carrier frequency of signals transmitted from the mobile terminal by a ratio r, and wherein:

the first correction procedure comprises determining the first frequency correction as the first receive frequency error;

transmitting the first transmit signal that is frequency-corrected by the first frequency correction comprises upconverting a first baseband signal that includes the first frequency correction using the frequency signal from the oscillator increased by the ratio r;

the second correction procedure comprises determining a frequency correction that multiplies by the ratio r a sum of twice the preceding oscillator error minus the determined second receive frequency error; and transmitting the second transmit that is frequency-corrected by the second frequency correction comprises upconverting a second baseband signal that includes the second frequency correction using the frequency signal from the oscillator increased by the ratio r.

* * * * *